(12) United States Patent
Kurita

(10) Patent No.: US 8,357,592 B2
(45) Date of Patent: Jan. 22, 2013

(54) METHOD AND APPARATUS FOR MANUFACTURING SEMICONDUCTOR SUBSTRATE DEDICATED TO SEMICONDUCTOR DEVICE, AND METHOD AND APPARATUS FOR MANUFACTURING SEMICONDUCTOR DEVICE

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 162 days.

(21) Appl. No.: 12/787,750

(22) Filed: May 26, 2010

(65) Prior Publication Data

US 2010/0304552 A1 Dec. 2, 2010

(30) Foreign Application Priority Data

Jun. 2, 2009 (JP) ................................ 2009-133180
Jun. 5, 2009 (JP) ................................ 2009-136024
Jun. 5, 2009 (JP) ................................ 2009-136362

(51) Int. Cl.
*H01L 21/332* (2006.01)
(52) U.S. Cl. ................ 438/473; 438/487; 257/E21.318
(58) Field of Classification Search ................ 438/471, 438/473–475, 487; 257/E21.318, E21.475
See application file for complete search history.

(56) References Cited

U.S. PATENT DOCUMENTS

| | | | |
|---|---|---|---|
| 4,782,029 A * | 11/1988 | Takemura et al. | ............ 438/472 |
| 5,734,195 A | 3/1998 | Takizawa et al. | |
| 5,874,348 A | 2/1999 | Takizawa et al. | |
| 2003/0148565 A1* | 8/2003 | Yamanaka | ..................... 438/200 |
| 2007/0193686 A1 | 8/2007 | Miyazaki et al. | |
| 2008/0096368 A1 | 4/2008 | Sakai | |
| 2009/0102024 A1* | 4/2009 | Takahi et al. | ................. 257/629 |
| 2010/0052093 A1 | 3/2010 | Hisatomi | |
| 2010/0062588 A1 | 3/2010 | Murakami | |

FOREIGN PATENT DOCUMENTS

| | | |
|---|---|---|
| JP | 6-338507 | 12/1994 |
| JP | 2003264194 | * 9/2003 |
| JP | 2003-338468 | 11/2003 |
| JP | 2006-313922 | 11/2006 |
| JP | 2008-108792 | 5/2008 |
| KR | 10-1999-0014341 | 2/1999 |
| KR | 10-2007-0069187 | 7/2007 |

OTHER PUBLICATIONS

Korea Office action. dated Jul. 29, 2011 along with an english translation thereof.
Korea Office action, dated Mar. 19, 2012 along with an english translation thereof.

* cited by examiner

*Primary Examiner* — Thanhha Pham
(74) *Attorney, Agent, or Firm* — Greenblum & Bernstein, P.L.C.

(57) ABSTRACT

A method for manufacturing a semiconductor substrate dedicated to a semiconductor device, in which multi-photon absorption is generated in a micro-region inside the semiconductor substrate by condensing laser beams in any micro-region inside the semiconductor substrate, and a gettering sink is formed by changing the crystal structure of only the micro-region.

5 Claims, 15 Drawing Sheets

METHOD AND APPARATUS FOR MANUFACTURING SEMICONDUCTOR SUBSTRATE DEDICATED TO SEMICONDUCTOR DEVICE, AND METHOD AND APPARATUS FOR MANUFACTURING SEMICONDUCTOR DEVICE

BACKGROUND OF THE INVENTION

1. Field of the Invention

The present invention relates to a method for manufacturing a semiconductor substrate dedicated to a semiconductor device, an apparatus for manufacturing a semiconductor substrate dedicated to a semiconductor device, a method for manufacturing a semiconductor device, and an apparatus for manufacturing a semiconductor device. Particularly, the present invention relates to a technology for readily forming a gettering site having a certain shape within a short time.

Priority is claimed on Japanese Patent Application No. 2009-133180, filed Jun. 2, 2009, No. 2009-136024, filed Jun. 5, 2009, and No. 2009-136362, filed Jun. 5, 2009, the content of which is incorporated herein by reference.

2. Description of Related Art

Recently, as electronics such as mobile phones and digital video cameras have been remarkably miniaturized, semiconductor devices such as semiconductor memory integrated into the electronics are also being miniaturized. The semiconductor memory is manufactured by forming a device on one surface of a silicon substrate (silicon wafer) made of, for example, single-crystal silicon. In order to miniaturize the semiconductor memory, the silicon substrate is thinned by grinding the back surface of the silicon substrate after forming a device on a surface of the silicon substrate to provide a thickness of, for example, 50 μm.

In such a thinning process of the semiconductor device, heavy metals may be introduced into the silicon substrate. If impurities such as heavy metals are introduced into the silicon substrate, a device characteristic is remarkably degraded due to a generation of a leak current or the like. Therefore, it is important to suppress diffusion of heavy metals in the device formation area after thinning the silicon substrate.

A gettering technique is widely known in the art as a method for removing heavy metals from the silicon substrate. In this technique, heavy metals in the device formation area are removed by forming an area for trapping heavy metals, called a gettering site, on the silicon substrate, and collecting the heavy metals in the gettering site through an annealing treatment or the like.

As a method for forming the gettering site on the silicon substrate, for example, there has been known an IG (Intrinsic gettering) method in which oxygen precipitates are formed on the silicon substrate (e.g., Japanese Unexamined Patent Application, First Publication No. H6-338507), an EG (extrinsic gettering) method in which a gettering site such as a backside defect is formed on the back surface of the silicon substrate (e.g., Japanese Unexamined Patent Application, First Publication No. 2006-313922), and the like.

The IG method of the related art is performed as a pre-process before a device is formed on the silicon substrate and requires a heat treatment temperature greater than or equal to 600° C. in order to remove heavy metals distributed on the silicon substrate. However, most of the heat treatments performed after forming the device on the silicon substrate are performed at a temperature less than or equal to 400° C., and the heavy metals introduced in the thinning process after forming the device may not be sufficiently trapped.

As recent semiconductor devices are being made thinner, the silicon substrate is required to have a thickness less than or equal to 50 to 40 μm, or further 30 μm. In the thinning process of a silicon substrate having such a thickness level, since most of the gettering sinks formed on the silicon substrate are removed by grinding, a sufficient gettering capability is hardly obtained.

Meanwhile, a large diameter substrate such as 300 mm wafer which has recently been popularized is polished in both surfaces. Therefore, in the EG method in which the gettering site such as backside defect is formed on the back surface of the silicon wafer, it may be difficult to form the gettering sink on the back surface.

SUMMARY OF THE INVENTION

The present invention provides a method for manufacturing a semiconductor substrate dedicated to a semiconductor device, capable of readily forming a gettering site for trapping heavy metals within a short time.

The present invention also provides a method for manufacturing a semiconductor device capable of removing heavy metal contamination after foaming the semiconductor device from a device formation area in a simple and reliable manner.

It was envisaged by inventors of the present invention that the gettering sink can be formed, for example, by condensing laser beams having a certain wavelength and a certain pulse width into a particular position in the thickness direction of the silicon substrate and reforming the characteristic of the single crystal silicon at the condensed position.

The formation of the gettering sink using the laser beam described above strongly depends on the laser irradiation condition such as laser power and a laser spot diameter. For example, since the laser beam condensed into an area less than or equal to 1 mm has energy sufficient to melt the single crystal silicon, it is possible to instantaneously form a processed deformation layer, i.e., the gettering sink.

However, during the formation of the gettering sink using the laser beam, the temperature of the single crystal silicon instantaneously increases in the proximity of the condensed spot of the laser beam. For this reason, a thermal shock wave is generated near the condensed spot, and internal stress is locally generated. It was proven that such internal stress may be alleviated by a thermal process such as a device formation process subsequent thereto, and a dislocation is extended from the formed gettering sink, such that the device characteristics may be degraded.

Accordingly, the present invention provides a method for manufacturing a semiconductor substrate dedicated to a semiconductor device, capable of readily forming the gettering site within a short time and reducing the generation of defects such as a dislocation caused by internal stress generated when the gettering site is formed.

In addition, the present invention provides an apparatus for manufacturing a semiconductor device, capable of readily forming the gettering site for trapping heavy metals within a short time. Furthermore, the present invention provides an apparatus for manufacturing the semiconductor substrate, capable of suppressing generation of a dislocation caused by internal stress.

Means for Solving the Problem

First Aspect

According to a first aspect of the present invention, there is provided a method for manufacturing a semiconductor substrate dedicated to a semiconductor device and a method for manufacturing a semiconductor device.

[A1] According to a first aspect of the present invention, there is provided a method for manufacturing a semiconductor substrate dedicated to a semiconductor device, the method includes, a multi-photon absorption process in which a laser beam is incident to one surface of the semiconductor substrate using a laser irradiation apparatus, and the laser beam is condensed into any micro-region of the semiconductor substrate, and forming a gettering sink by changing a crystal structure of the micro-region through the multi-photon absorption process, wherein the gettering sink is formed in a 3-dimensional shape broadening in parallel with one surface of the semiconductor substrate and extending in the thickness direction of the semiconductor substrate.

[A2] In the method for manufacturing a semiconductor substrate dedicated to a semiconductor device according to the paragraph [A1], it is preferable that the gettering sink be formed in a cubic shape, a rectangular parallelepiped shape, or a columnar shape.

[A3] In the method for manufacturing a semiconductor substrate dedicated to a semiconductor device according to the paragraphs [A1] or [A2], it is preferable that a plurality of gettering sinks be formed in positions overlapped with one another along the thickness direction of the semiconductor substrate.

[A4] In the method for manufacturing a semiconductor substrate dedicated to a semiconductor device according to any one of the paragraphs [A1] to [A3], it is preferable that the laser beam be an ultra-short pulsed-laser beam having a pulse width of $1.0\times10^{-15}$ to $1.0\times10^{-8}$ seconds and a wavelength of 300 to 1200 nm.

[A5] In the method for manufacturing a semiconductor substrate dedicated to a semiconductor device according to the paragraph [A4], it is preferable that the ultra-short pulsed-laser beam in the micro-region be controlled such that a peak output density ranges from $1.0\times10^6$ to $1.0\times10^{11}$ sec·W/cm² and a beam diameter ranges from 1 μm to 10 mm.

[A6] In the method for manufacturing a semiconductor substrate dedicated to a semiconductor device according to any one of the paragraphs [A1] to [A5], it is preferable that the semiconductor substrate is formed of single crystal silicon, and at least amorphous structure silicon be formed in the gettering sink.

[A7] In the method for manufacturing a semiconductor substrate dedicated to a semiconductor device according to any one of the paragraphs [A1] to [A6], it is preferable that the forming the gettering sink be performed under a non-oxidizing gas atmosphere containing at least one selected from a group consisting of nitrogen, argon, and hydrogen.

[A8] In the method for manufacturing a semiconductor substrate dedicated to a semiconductor device according to any one of the paragraphs [A1] and [A7], it is preferable that the method further include forming an epitaxial layer on one surface of the semiconductor substrate.

[A9] Furthermore, according to a first aspect of the present invention, there is provided a method for manufacturing a semiconductor device, the method includes, forming a semiconductor device in positions overlapped with each gettering sink of the semiconductor substrate obtained by the method for manufacturing a semiconductor substrate dedicated to a semiconductor device according to any one of the paragraphs [A1] to [A8], annealing the semiconductor substrate dedicated to a semiconductor device in a predetermined temperature, and trapping heavy metals in the gettering sink Second Aspect According to a second aspect of the present invention, there are provided a method for manufacturing a semiconductor substrate dedicated to a semiconductor device and an apparatus for manufacturing a semiconductor substrate dedicated to a semiconductor device.

[B1] According to a second aspect of the present invention, there is provided a method for manufacturing a semiconductor substrate dedicated to a semiconductor device, the method includes, heating the semiconductor substrate in a temperature range greater than or equal to 400° C. and less than or equal to 1000° C., a multi-photon absorption process in which a laser beam is incident to one surface of the heated semiconductor substrate, and the laser beam is condensed into any micro-region of the heated semiconductor substrate, and forming a gettering sink by changing a crystal structure of the micro-region through the multi-photon absorption process.

[B2] In the method for manufacturing a semiconductor substrate dedicated to a semiconductor device according to the paragraph [B1], it is preferable that the laser beam be an ultra-short pulsed-laser beam having a pulse width of $1.0\times10^{-15}$ to $1.0\times10^{-8}$ seconds and a wavelength of 300 to 1200 nm.

[B3] In the method for manufacturing a semiconductor substrate dedicated to a semiconductor device according to the paragraph [B2], it is preferable that the ultra-short pulsed-laser beam in the micro-region be controlled such that a peak output density ranges from $1.0\times10^6$ to $1.0\times10^{11}$ sec·W/cm² and a beam diameter ranges from 1 μm to 10 mm.

[B4] In the method for manufacturing a semiconductor substrate dedicated to a semiconductor device according to any one of the paragraphs [B1] to [B3], it is preferable that the forming the gettering sink be performed under a non-oxidizing gas atmosphere containing at least one selected from a group consisting of nitrogen, argon, and hydrogen.

[B5] In the method for manufacturing a semiconductor substrate dedicated to a semiconductor device according to any one of the paragraphs [B1] to [B4], it is preferable that the method further include forming an epitaxial layer on one surface of the semiconductor substrate.

[B6] According to a second aspect of the present invention, there is provided an apparatus for manufacturing a semiconductor substrate dedicated to a semiconductor device, the apparatus includes, a laser irradiator that irradiates an ultra-short pulsed-laser beam having a pulse width of $1.0\times10^{-15}$ to $1.0\times10^{-8}$ seconds and a wavelength of 300 to 1200 nm onto the semiconductor substrate, a stage that mounts a semiconductor substrate, and a substrate heating unit that heats the semiconductor substrate in a temperature range greater than or equal to 400° C. and less than or equal to 1000° C.

[B7] In the apparatus for manufacturing a semiconductor substrate dedicated to a semiconductor device according to the paragraph [B6], it is preferable that the substrate heating unit be a stage heater for heating the stage.

Third Aspect

According to a third aspect of the present invention, there are provided a method for manufacturing a semiconductor substrate dedicated to a semiconductor device, a method for manufacturing a semiconductor device, and an apparatus for manufacturing a semiconductor device.

[C1] According to a third aspect of the present invention, there is provided a method for manufacturing a semiconductor substrate dedicated to a semiconductor device, the method includes, a multi-photon absorption process in which laser beams are simultaneously incident to at least two areas on one surface of the semiconductor substrate using a laser irradiation apparatus capable of irradiating laser beams from an irradiation surface along a plurality of optical axes parallel to one another, and the laser beams are condensed into each of a plurality of micro-regions of the semiconductor substrate, and forming a plurality of gettering sinks by changing crystal structures of the micro-regions through the multi-photon absorption process.

[C2] In the method for manufacturing a semiconductor substrate dedicated to a semiconductor device according to the paragraph [C1], it is preferable that the laser beam be an ultra-short pulsed-laser beam having a pulse width of $1.0 \times 10^{-15}$ to $1.0 \times 10^{-8}$ seconds and a wavelength of 300 to 1200 nm

[C3] In the method for manufacturing a semiconductor substrate dedicated to a semiconductor device according to the paragraph [C2], it is preferable that the ultra-short pulsed-laser beam in the micro-region be controlled such that a peak output density ranges from $1.0 \times 10^6$ to $1.0 \times 10^{11}$ sec·W/cm$^2$ and a beam diameter ranges from 1 μm to 10 mm.

[C4] In the method for manufacturing a semiconductor substrate dedicated to a semiconductor device according to any one of the paragraphs [C1] to [C3], it is preferable that the semiconductor substrate be formed of single crystal silicon, and at least amorphous structure silicon is formed in the gettering sink.

[C5] In the method for manufacturing a semiconductor substrate dedicated to a semiconductor device according to any one of the paragraphs [C1] to [C4], it is preferable that the forming the gettering sinks be performed under a non-oxidizing gas atmosphere containing at least one selected from a group consisting of nitrogen, argon, and hydrogen.

[C6] In the method for manufacturing a semiconductor substrate dedicated to a semiconductor device according to any one of the paragraphs [C1] to [C5], it is preferable that the method further include forming an epitaxial layer on one surface of the semiconductor substrate.

[C7] According to a third aspect of the present invention, there is provided a method for manufacturing a semiconductor device, the method includes, forming semiconductor devices in positions overlapped with each of the gettering sinks of the semiconductor substrate obtained by the semiconductor substrate dedicated to a semiconductor device according to any one of the paragraphs [C1] to [C5], annealing the semiconductor substrate in a predetermined temperature, and trapping heavy metals in the gettering sink.

[C8] According to a third aspect of the present invention, there is provided an apparatus for manufacturing a semiconductor device, the apparatus comprising a laser irradiator that irradiates an ultra-short pulsed-laser beam having a pulse width of $1.0 \times 10^{-15}$ to $1.0 \times 10^{-8}$ seconds and a wavelength of 300 to 1200 nm onto the semiconductor substrate from an irradiation surface along a plurality of optical axes parallel to one another.

[C9] In the apparatus for manufacturing a semiconductor device according to the paragraph [C8], it is preferable that the laser irradiator include at least one laser source and a plurality of optical guiding members that guide the ultra-short pulsed-laser beam from the laser source so as to be output along a plurality of optical axes from the irradiation surface.

[C10] In the apparatus for manufacturing a semiconductor device according to the paragraph [C8], it is preferable that the laser irradiator be obtained by arranges a plurality of laser sources on the irradiation surface.

Effects of the Invention

In a method for manufacturing the semiconductor substrate dedicated to a semiconductor device according to first to third aspects of the present invention, since a multi-photon absorption process is generated in the micro-region inside the semiconductor substrate by condensing laser beams into any micro-region inside the semiconductor substrate, it is possible to readily form the gettering sink by changing only the crystal structure of the corresponding micro-region.

Particularly, according to the first aspect of the present invention, in the process of forming the gettering sink, the gettering sink is formed in any 3-dimensional shape broadening in parallel with the one surface of the semiconductor substrate and extending in a thickness direction of the semiconductor substrate. Therefore, it is possible to form the gettering sink having little dislocation defect by suppressing generation and extending of a crystal dislocation caused by condensing the laser beam.

In the method for manufacturing a semiconductor device according to a first aspect of the present invention, it is possible to readily manufacture a high performance semiconductor device, in which heavy metals are reliably trapped, with in a short time.

In the method for manufacturing a semiconductor substrate dedicated to a semiconductor device according to a second aspect of the present invention, during the substrate heating process, the semiconductor substrate is heated in a predetermined temperature range, for example, greater than or equal to 400° C. and less than or equal to 1000° C. Therefore, it is possible to suppress an excessive temperature change caused by the condensed laser beam so as to prevent a temperature of the semiconductor substrate from locally rapidly rising or falling.

In the vicinity of the condensing spot of the laser beam, the temperature of the single crystal silicon instantaneously rises to a high temperature. Therefore, if the laser beam is incident to the semiconductor substrate, for example, at a room temperature, a thermal shock wave is generated in the vicinity of the condensing spot, and an internal stress is locally generated. Such an internal stress is alleviated by a thermal process such as a subsequent device formation process, and a dislocation expands from the gettering sink that has been provided, so that a device characteristic may be degraded.

As described in the second aspect of the present invention, when the semiconductor substrate is previously heated through the substrate heating process in a predetermined temperature range, for example, greater than or equal to 400° C. and less than or equal to 1000° C., it is possible to reduce a temperature difference between a highest temperature in the vicinity of the condensing spot and the temperature of the entire semiconductor substrate when the laser beam is incident. Therefore, it is possible to prevent an excessive temperature change caused by forming the gettering site using a laser beam and suppress generation of an internal stress. In addition, it is possible to form a semiconductor substrate dedicated to a semiconductor device having little possibility of generating the dislocation defect.

In the apparatus for manufacturing a semiconductor substrate dedicated to a semiconductor device according to a second aspect of the present invention, by providing substrate heating unit for heating the semiconductor substrate in a temperature range greater than or equal to 400° C. and less than or equal to 1000° C., it is possible to reduce a temperature difference between a highest temperature in the vicinity of the condensing spot and the temperature of the entire semiconductor substrate when the laser beam is incident. Therefore, it is possible to prevent an excessive temperature change caused by foaming the gettering site using a laser beam and suppress generation of an internal stress.

In the process of forming the gettering sink according to a third aspect of the present invention, a plurality of lines of laser beams are simultaneously (concurrently) irradiated from the irradiation surface along a plurality of optical axes parallel to one another. Therefore, it is possible to simultaneously form a plurality of gettering sinks within a remarkably short time, for example, in comparison with a method for scanning a single laser beam or a method for irradiating the laser beam while moving the semiconductor substrate. In addition, even for a large-sized single crystal wafer, it is possible to form a plurality of gettering sinks in a batch process by increasing the number of the laser sources provided along the irradiation surface without increasing the time for forming the gettering sinks.

In the method for manufacturing a semiconductor device according to a third aspect of the present invention, during the process of forming the gettering sinks, it is possible to form a plurality of gettering sinks within a short time by simultaneously (concurrently) irradiating a plurality of lines of laser beams from the irradiation surface along a plurality of optical axes parallel to one another. Therefore, it is possible to readily manufacture a high performance semiconductor device, in which heavy metals are reliably trapped, within a short time.

In the apparatus for manufacturing a semiconductor device according to a third aspect of the present invention, since a laser irradiator that irradiates laser beams onto the semiconductor substrate along a plurality of optical axes parallel to one another is provided in the irradiation surface, it is possible to simultaneously (concurrently) irradiate a plurality of lines of laser beams and simultaneously form a plurality of gettering sinks within a short time.

DETAILED DESCRIPTION OF THE INVENTION

Figure 1:
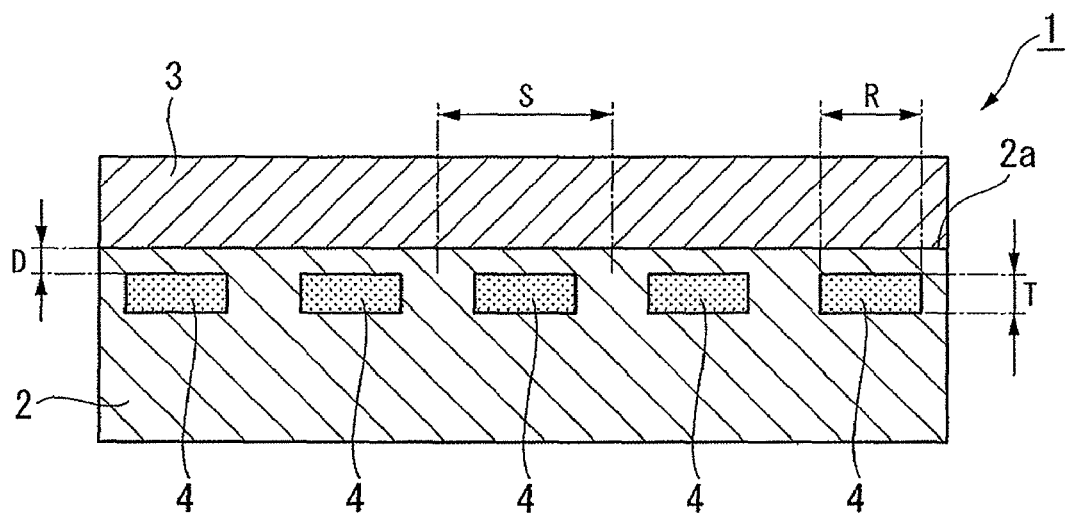
FIG. 1 is a cross-sectional view illustrating an example of semiconductor substrate dedicated to a semiconductor device.

Hereinafter, a method for manufacturing a semiconductor substrate dedicated to a semiconductor device, an apparatus for manufacturing a semiconductor substrate dedicated to a semiconductor device, a method for manufacturing a semiconductor device, and an apparatus for manufacturing a semiconductor device according to first to third aspects of the present invention will be described with reference to the accompanying drawings.

The first to third aspects of the present invention are just exemplary in order to facilitate understanding of the spirit of the invention, but are not intended to limit the present invention unless specified otherwise. In addition, some main elements illustrated in the drawings used in the following descriptions are sometimes enlarged or exaggerated for convenient understanding of the characteristics of the invention, of which scaling factors or dimensions may not necessarily match with the actual size.

First, a configuration example of a semiconductor substrate dedicated to a semiconductor device will be described. FIG. 1 is an enlarged cross-sectional view illustrating a semiconductor substrate dedicated to a semiconductor device. The semiconductor substrate dedicated to a semiconductor device 1 (hereinafter, referred to as a semiconductor substrate) includes a single crystal wafer 2 and an epitaxial layer 3 formed on one surface 2a of the single crystal wafer 2. A plurality of gettering sinks 4 for trapping heavy metals of the semiconductor substrate 1 are provided in the proximity of the one surface 2a of the single crystal wafer 2.

The semiconductor substrate 1 may be preferably used as a substrate dedicated to the semiconductor device such as a substrate for manufacturing a solid-state imaging device. The single crystal wafer 2 may be, for example, a silicon single crystal wafer. The epitaxial layer 3 may be a silicon epitaxial growth film grown from one surface 2a of the single crystal wafer 2.

The gettering sink 4 may be an amorphous-like structure obtained by amorphizing a part of the single crystal silicon. The gettering sink 4 has a capability of trapping heavy metals just when there is weak deformation within the crystal structure thereof so that it is possible to allow it to function as the gettering sink just by amorphizing a very little part thereof. In addition, the gettering sink 4 can be formed by generating a multi-photon absorption process at part of the single crystal wafer 2 and reforming the crystal structure by condensing laser beams.

The gettering sink 4 may be formed at positions overlapped with at least an area for forming each semiconductor device (for example, solid-state imaging device) when the solid-state imaging device is foamed using this semiconductor substrate. For example, a single gettering sink 4 may be formed in a disc shape having a diameter R of 50 to 150 μm and a thickness T of 10 to 150 μm. In addition, the depth D of the gettering sink 4 is preferably set to 0.5 to 2 μm from one surface 2a of the single crystal wafer 2. In addition, the gettering sink 4 may be provided on an epitaxial layer 3 formed on an upper layer of the single crystal wafer 2. When the gettering sink 4 is formed on the epitaxial layer 3, the gettering sink 4 is preferably formed inside the epitaxial layer so as not to be exposed to the surface contacting with a device.

Next, a configuration example of a semiconductor device using the semiconductor substrate dedicated to the semiconductor device 1 will be described. In addition, in the following first to third aspects of the present invention, a solid-state imaging device will be described, as an example for the semiconductor device.

Figure 2:
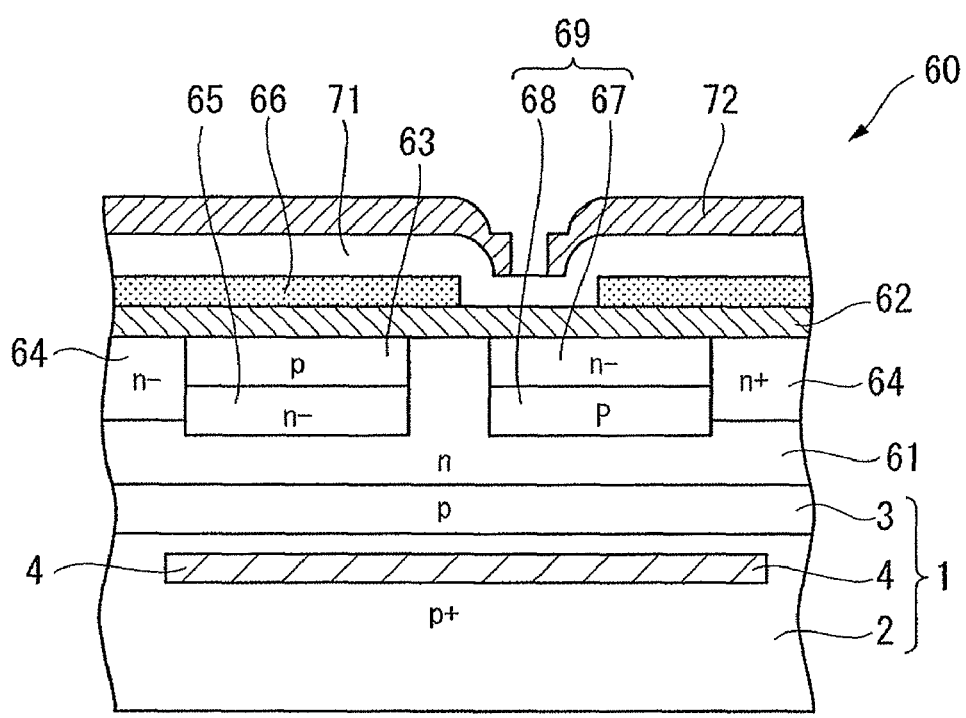
FIG. 2 is a cross-sectional view illustrating an example of a semiconductor device.

FIG. 2 is a cross-sectional view illustrating an example of a solid-state imaging device configured using an epitaxial substrate for the solid-state imaging device according to the present invention. The solid-state imaging device 60 is manufactured using a semiconductor substrate 1 (a semiconductor substrate dedicated to a semiconductor device) obtained by forming a p-type epitaxial layer 3 on a semiconductor substrate (a silicon substrate) 2 and forming gettering sinks on the single crystal wafer 2.

A first n-type well region 61 is formed on a predetermined position in the epitaxial layer 3. An n-type channel stop region 64, a second n-type well region 65, and a p-type transmission channel region 63 constituting a vertical transmission register are formed inside the first n-type well region 61.

In addition, a transmission electrode 66 is formed on a predetermined position in the gate insulation film 62. A photodiode (semiconductor device) 69 where an n-type positive charge accumulation region 67 and a p-type impurity diffusion region 68 are stacked is formed by selectively implanting p-type and n-type impurities into the second n-type well region 65 and the p-type transmission channel region 63. Furthermore, an interlayer insulation film 71 which covers them and a light shield film 72 which covers a surface except for an immediate upper portion of the photodiode 69 are provide.

In the solid-state imaging device 60 having such a configuration, heavy metals included in the semiconductor substrate 1 are reliably trapped by the gettering sink 4 formed in the single crystal wafer 2. Therefore, it is possible to suppress dark-current leakage (a leakage current generated when a dark current flows) in the photodiode (a semiconductor device) 69, which produces degradation in an imaging capability of the solid-state imaging device 60.

In summary, it is possible to implement a solid-state imaging device 60 having an excellent imaging property and little dark-current leakage by forming the solid-state imaging device 60 using the semiconductor substrate 1 obtained by a method for manufacturing a semiconductor substrate dedicated to a semiconductor device according to the following first to third aspects of the present invention.

First Aspect

Next, a method for manufacturing a semiconductor substrate dedicated to a semiconductor device and a method for manufacturing a semiconductor device using the same according to a first aspect of the present invention will be described. FIGS. 3A to 3D are cross-sectional views sequentially illustrating a method for manufacturing a solid-state imaging device as an example of the semiconductor device.

Figure 3A:
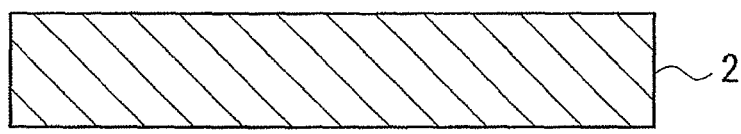
FIGS. 3A to 3D are cross-sectional views illustrating a method for manufacturing a semiconductor substrate dedicated to a semiconductor device according to a first aspect of the present invention.

In order to manufacture a semiconductor substrate dedicated to a semiconductor device (hereinafter, referred to as a semiconductor substrate), single crystal wafer 2 is first prepared (refer to FIG. 3A). The single crystal wafer 2 may be, for example, a single crystal silicon wafer manufactured by slicing a single crystal silicon ingot.

Figure 3B:
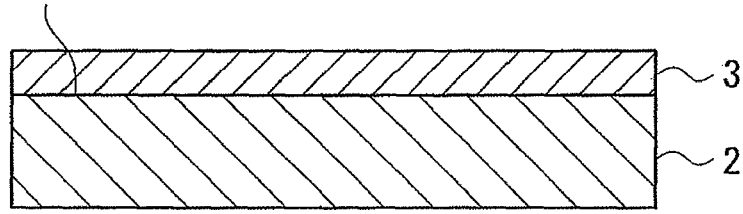

Next, for example, an epitaxial layer 3 is formed on one surface 2a of this single crystal wafer 2 (refer to FIG. 3B: an epitaxial growth process). In the formation of the epitaxial layer 3, the epitaxial layer 3 including a single crystal silicon on one surface 2a may be grown by introducing raw gases while heating the single crystal wafer 2 in a predetermined temperature, for example using an epitaxial growth apparatus.

Figure 3C:
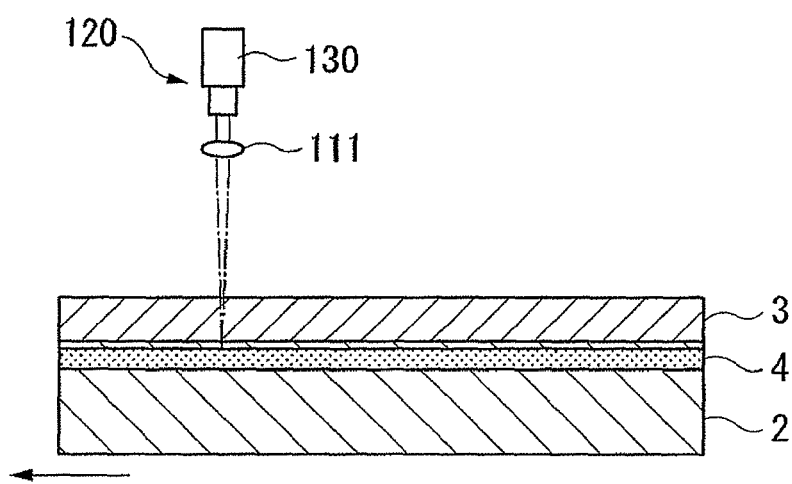

Next, the single crystal wafer 2 having the epitaxial layer 3 is set on a laser irradiation apparatus 120, and laser beams are irradiated while moving the single crystal wafer 2 based on imaging data of the CCD camera 130 (refer to FIG. 3C). At this moment, the laser beams output from the laser generator 115 (refer to FIG. 4) are condensed by the condensing lens (a condensing unit) 111 (refer to FIG. 3C and FIG. 4) such that a condensing point (a focal point) is positioned, for example, at a depth of several tens μm from one surface 2a of the single crystal wafer 2. As a result, the crystal structure of the single crystal wafer 2 is reformed, and the gettering sink 4 is formed (a gettering sink formation process). In addition, this gettering sink 4 formation process will be described in detail later.

Figure 3D:
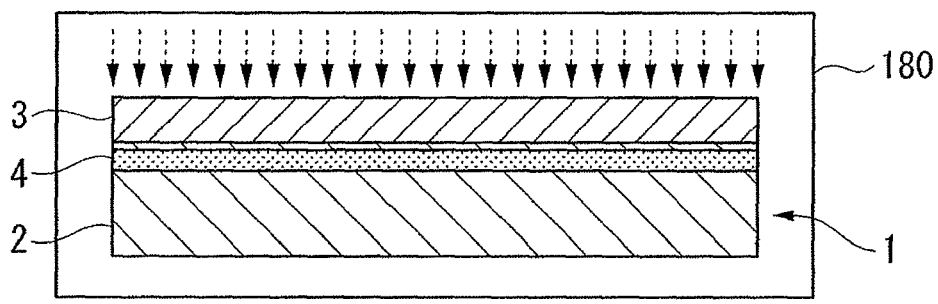

The single crystal wafer 2 having the epitaxial layer 3 and the gettering sinks 4 is further heated in a predetermined temperature by an annealing apparatus 180 (refer to FIG. 3D: a gettering process). As a result, the heavy metals diffused within the single crystal wafer 2 are collected in the gettering sinks 4, and it is possible to obtain a semiconductor substrate 1 (semiconductor substrate dedicated to a semiconductor device) having few heavy metals in the device formation area.

Then, by forming, for example, a photodiode (as a semiconductor device) overlapped on the epitaxial layer 3 of the semiconductor substrate 1 (a semiconductor substrate dedicated to a semiconductor device) (a device formation process), it is possible to obtain a solid-state imaging device (a semiconductor device) having an excellent properties and little leak current caused by the heavy metals.

In addition, while the gettering process is previously performed before the semiconductor device is formed according to a first aspect of the present invention, the annealing may be performed after the semiconductor device is formed to collect the heavy metals in the gettering sinks 4.

Figure 4:
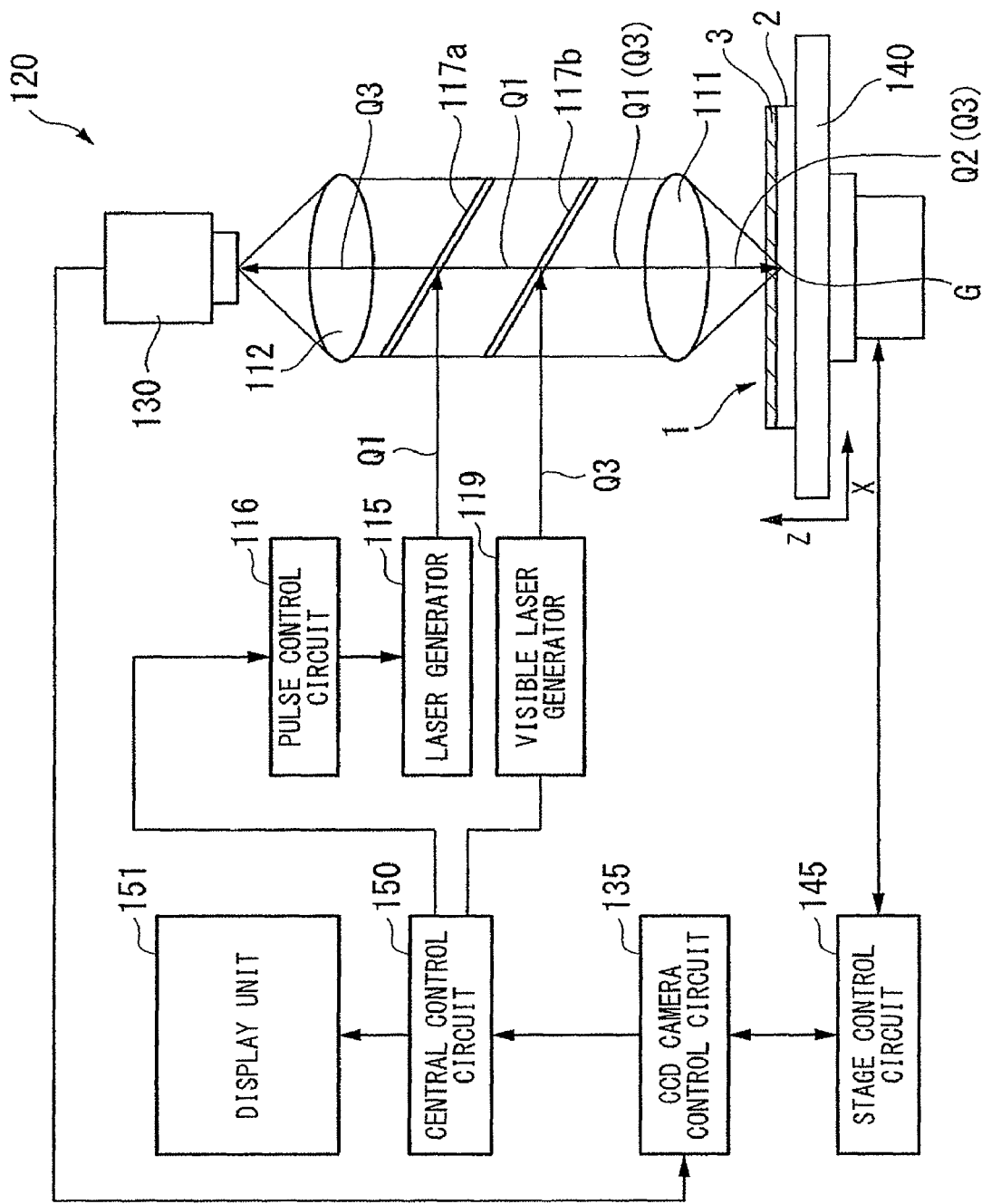
FIG. 4 is a schematic diagram illustrating an example of an apparatus for manufacturing a semiconductor device according to a first aspect of the present invention.

FIG. 4 is a schematic diagram illustrating an example of a laser irradiation apparatus for forming gettering sinks on a single crystal wafer according to a first aspect of the present invention. The laser irradiation apparatus 120 includes a laser generator 115 for pulse-oscillating laser beams Q1, a pulse control circuit 116 (Q-switch) for controlling the pulses of the laser beams Q1, a beam splitter (a half-mirror) 117a for reflecting the laser beams Q1 to change a propagation direction of the laser beams Q1 by 90° toward the single crystal wafer 2, and a condensing lens (a condensing unit) 111 for condensing laser beams Q1 reflected by the beam splitter 117a.

The laser irradiation apparatus 120 further includes a stage 140 for mounting the single crystal wafer 2 having the epitaxial layer 3. The stage 140 is controlled to move in a vertical direction Z and a horizontal direction X by the stage control circuit 145 in order to focus the laser beams on the focal point by condensing the laser beams Q2 into any position of the single crystal wafer 2.

The laser generator 115 and the pulse control circuit 116 may be configured to irradiate laser beams capable of forming the gettering sinks by reforming the crystal structure at any position within the single crystal wafer, but are not particularly limited thereto. Particularly, it is preferable to use a titanium sapphire laser capable of oscillating within a wavelength range capable of transmitting through the semiconductor wafer and in a short pulse period. In addition, Table 1 shows a specific example of laser irradiation conditions suitable for each of a general semiconductor wafer and a silicon wafer.

TABLE 1

| WAFER TYPE | LASER IRRADIATION CONDITION | |
|---|---|---|
| | SEMICONDUCTOR WAFER | SILICON WAFER |
| BEAM WAVELENGTH | 300 to 1200 nm | 1000 to 1200 nm |
| BEAM DIAMETER | 0.1 to 100 μm | 0.5 to 1.0 μm |
| REPETITION FREQUENCY | 0.001 to 100 MHz | 10 to 100 MHz |
| PULSE WIDTH | $1.0 \times 10^{-15}$ to $1.0 \times 10^{-8}$ sec | $1.0 \times 10^{-15}$ to $1.0 \times 10^{-9}$ sec |
| OUTPUT | 1 to 1000 mJ/pulse | 1 to 100 mJ/pulse |

* Laser Irradiation Condition of Laser Beams Q1 and Q2 (Laser Irradiation Condition Capable of Transmitting Silicon).

The pulse widths of the laser beams Q1 and Q2 are set to, preferably, $1.0 \times 10^{-14}$ to $1.0 \times 10^{-9}$ seconds, and more preferably, $1.0 \times 10^{-10}$ to $1.0 \times 10^{-9}$ seconds. The wavelengths of the laser beams Q1 and Q2 are set to, preferably, 1010 to 1090 nm, and more preferably, 1030 to 1060 nm.

The optical path width of the laser beam Q1 generated from the laser generator 115 is converged by the condensing lens 111. The stage 140 is controlled in a vertical direction Z such that the converged laser beam Q2 is focused (condensed) on the focal point G at an arbitrary depth D of the single crystal wafer 2. In the condensing lens 111, it is preferable that, for example, a magnification be set to 10 to 300, a numerical aperture N/A be set to 0.3 to 0.9, and a transmittance for a laser beam wavelength be set to 30 to 60%.

The laser irradiation apparatus 120 further includes a visible laser generator 119, a beam splitter (a half-mirror) 117b, a CCD camera 130, a CCD camera control circuit 135, a focusing lens 112, a central control circuit 150, and a display unit 151.

The visible laser beam Q3 generated from the visible laser generator 119 is reflected by the beam splitter (half-mirror) 117b, refracted by 90°, and arrives at the epitaxial layer 3 of the single crystal wafer 2. Then, the visible laser beam Q3 is reflected by the surface of the epitaxial layer 3, transmits through the condensing lens 111 and the beam splitters 117a and 117b, and arrives at the focusing lens 112. The visible laser beam Q3 arriving at the focusing lens 112 are captured by the CCD camera 130 as a surface image on the single crystal wafer 2, and the resultant captured images are input to the CCD cameral control circuit 135. The stage control circuit 145 controls a movement amount in a horizontal direction X of the stage 140 based on the input imaging data.

Figure 5:
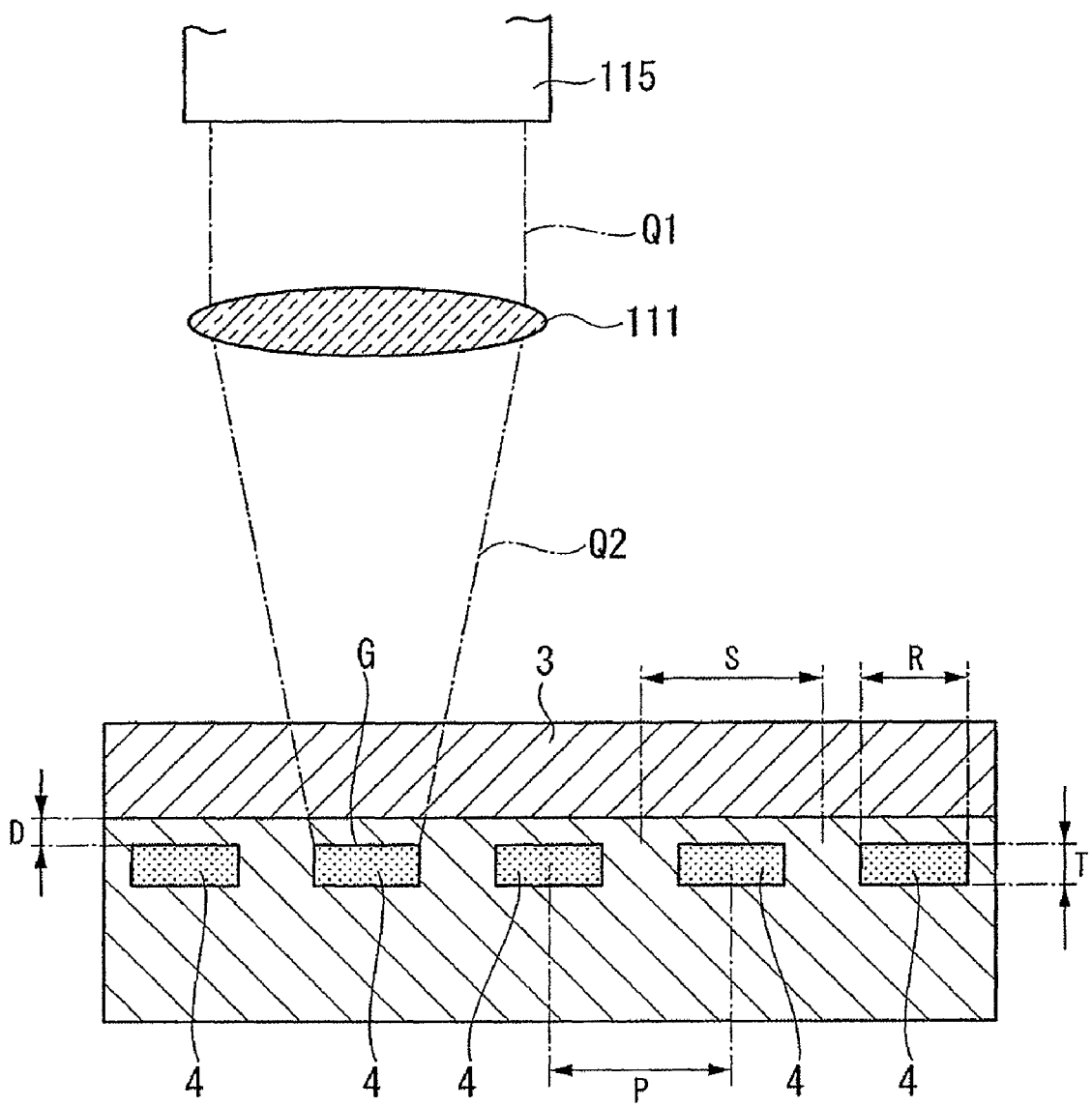
FIG. 5 is an enlarged cross-sectional view illustrating a process of forming a gettering sink according to a first aspect of the present invention.

Next, a method for forming the gettering sinks 4 in the single crystal wafer 2 having the epitaxial layer 3 will be described. FIG. 5 is a schematic diagram illustrating how the gettering sinks are formed on a semiconductor wafer using laser beams. In order to form the gettering sinks 4 on the single crystal wafer 2, the laser beam Q1 output from the laser generator 115 is converged by the condensing lens (a condensing unit) 111. Since the converged laser beam Q2 has a wavelength range capable of transmitting through silicon, the laser beam Q2 arrives at the surface of the epitaxial layer 3 and is directly incident thereto without reflection.

Meanwhile, the position of the single crystal wafer 2 having the epitaxial layer 3 is determined such that the condensing point (focal point) G of the laser beam Q2 has a predetermined depth D from one surface 2a of the single crystal wafer 2. As a result, the multi-photon absorption is generated in only the area of the single crystal wafer 2 where the condensing points (focal points) G of the laser beams Q2 are focused.

It is noted that, in the multi-photon absorption process, a large amount of energy is selectively absorbed only in the irradiation area by irradiating a large amount of photons onto a particular area (the irradiation area) within a short time. Therefore, reaction occurs such that crystal binding at the irradiation area changes. According to a first aspect of the present invention, the semiconductor wafer of the single crystal structure is reformed at the condensing point (focal point), and a partially amorphous-like crystal structure is generated by condensing laser beams into an arbitrary area inside the single crystal wafer 2. Such reformation of the crystal structure may be performed to trap the heavy metals, i.e., weak deformation is generated in the crystal structure.

As described above, according to a first aspect of the present invention, the irradiation position of the condensing point (focal point) G of laser beam Q2 is set by converging laser beams Q1 into any micro-region inside the single crystal wafer 2. In addition, it is possible to form the gettering sink 4 in any micros-region of the singe crystal wafer 2 by reforming the crystal structure of the micro-region.

In the laser beam for forming the gettering sinks 4, it is important to set a condition capable of reliably transmitting the laser beam without reforming the crystal structure of the epitaxial layer 3 or the single crystal wafer 2 in the optical path before the laser beam arrives at the condensing point (focal point). Such an irradiation condition of the laser beam is determined by a forbidden band (an energy band gap) which is a basic material property of the semiconductor material. For example, since the forbidden band of a silicon semiconductor is 1.1 eV, when the incident wavelength is greater than or equal to 1000 nm, transmitivity becomes significant. As described above, the wavelength of the laser beam can be determined considering the forbidden band of the semiconductor material.

In a high output power laser such as a YAG laser used as the laser beam generator, thermal energy may be transferred to neighboring areas thereof as well as to the positions having a predetermined depth. Therefore, a low output power laser, for example, an ultra-short pulsed-laser such as a femto-second laser is preferable.

The ultra-short pulsed-laser may be used to set the wavelength of the laser beam to any range by exciting the titanium sapphire crystals (solid-state laser crystals) using a semiconductor laser or the like. Since the ultra-short pulsed-laser can set a pulse width of the laser beam to be less than or equal to $1.0 \times 10^{-15}$ femto-seconds, it is possible to suppress diffusion of a thermal energy generated by excitation and concentrate the optical energy only on the condensing point (focal point) of the laser beam in comparison with other lasers.

It is estimated that the gettering sink 4 formed by reforming the crystal structure through the multi-photon absorption process has an amorphous-like crystal structure.

In order to obtain such an amorphous-like crystal structure, it is necessary to locally rapidly heat and cool the areas where the condensing points (focal points) of the laser beams are focused. While the ultra-short pulsed-laser having the properties shown in Table 1 has a small energy amount, it can provide a sufficient energy to locally rapidly heat the single crystal wafer 2 by condensing laser beams using the condensing lens 111. The temperature of the condensing point (focal point) G of the laser beam reaches 9900 to 10000 K (9627 to 9727° C.). In addition, since the laser beams are condensed into the condensing point (focal point) G, a heat input range of the laser beam on the single crystal wafer 2 is significantly narrow. Therefore, if the condensing point (focal point) G moves by shifting the stage 140 where the single crystal wafer 2 is mounted or scanning laser beams, the heat input amount at the condensing point (focal point) before the movement is abruptly reduced so as to obtain a rapid cooling effect.

By setting the wavelength to 1000 nm as in the ultra-short pulsed-laser shown in Table 1, it is possible to increase transmitivity for the epitaxial layer 3 or the single crystal wafer 2, and reform only the micro-region at the condensing point of the laser beam (focal point) G without affecting the crystal structure of the epitaxial layer 3 or the like. The reformed portion of the crystal structure may be preferably used as the gettering sink 4 of the semiconductor substrate 2.

In addition, if the wavelength of the laser beam is larger than 1200 nm, which is a long-wavelength range, the photon energy (laser beam energy) decreases. Therefore, it may be impossible to obtain a sufficient photon energy to internally reform the semiconductor substrate even by condensing the laser beam, and thus, it is preferable that the wavelength of the laser beam be less than or equal to 1200 nm.

According to a first aspect of the present invention, the laser beams Q2 transmitting through the semiconductor wafer are condensed into the condensing point (focal point) G. Therefore, multi-photon absorption is generated in the condensing point (focal point) G.

A diameter of the laser beam at the condensing point (focal point) G is preferably greater than or equal to 1 µm and less than or equal to 10 mm, and more preferably, greater than or equal to 1 µm and less than or equal to 1 mm. The peak output density is preferably greater than or equal to $1.0 \times 10^6$ sec·W/cm$^2$ and less than or equal to $1.0 \times 10^{11}$ sec·W/cm$^2$, and more preferably, greater than or equal to $1.0 \times 10^7$ sec·W/cm$^2$ and less than or equal to $1.0 \times 10^{10}$ sec·W/cm$^2$. If the beam diameter and the peak output density at the condensing point (focal point) G satisfy the aforementioned conditions, it is possible to obtain the effect of multi-photon absorption.

The position of the condensing point (focal point) G of the laser beam, i.e., the position of forming the gettering sink 4 on the single crystal wafer 2 can be controlled by vertically or horizontally moving the stage 140. The position of the condensing point (focal point) G of the laser beam can also be controlled by controlling the position of the condensing unit (condensing lens) 111 in addition to the horizontal and vertical movement of the state 140. The distribution density of the gettering sink 4 can be set by the movement, i.e., the scanning pitch P of the condensing point (focal point) G of the laser beam.

For example, when the gettering sink 4 is formed by reforming a depth of 2 µm from the surface of the semiconductor substrate, the laser beam is focused (condensed) on a depth of 2 µm from the surface by setting the wavelength of the laser beam to 1080 nm and using a condensing lens (a magnification of 50) having transmitivity of 60%. Then, by generating multi-photon absorption inside the single crystal wafer, it is possible to form a reformation portion (gettering sink).

Meanwhile, the shape of the gettering sink 4 can be controlled by scanning the laser beam along one surface of the single crystal wafer 2 or horizontally adjusting the stage. The gettering sink 4 may be formed in any 3-dimensional shape broadening in parallel with the one surface of the single crystal wafer 2 and extending in the thickness direction of the single crystal wafer 2. Specifically, the gettering sink 4 may have, for example, a cubic shape, a rectangular parallelepiped shape, a columnar shape, or the like.

Figure 6A:
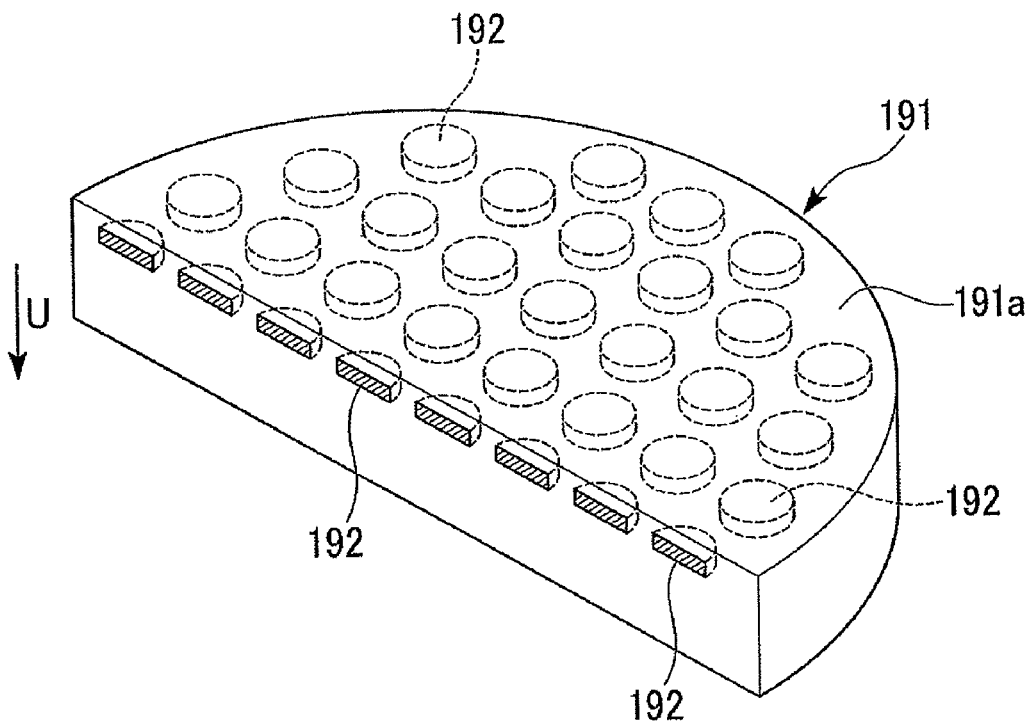
FIGS. 6A and 6B are exploded perspective diagrams illustrating an exemplary shape of a gettering sink according to a first aspect of the present invention.
Figure 6B:
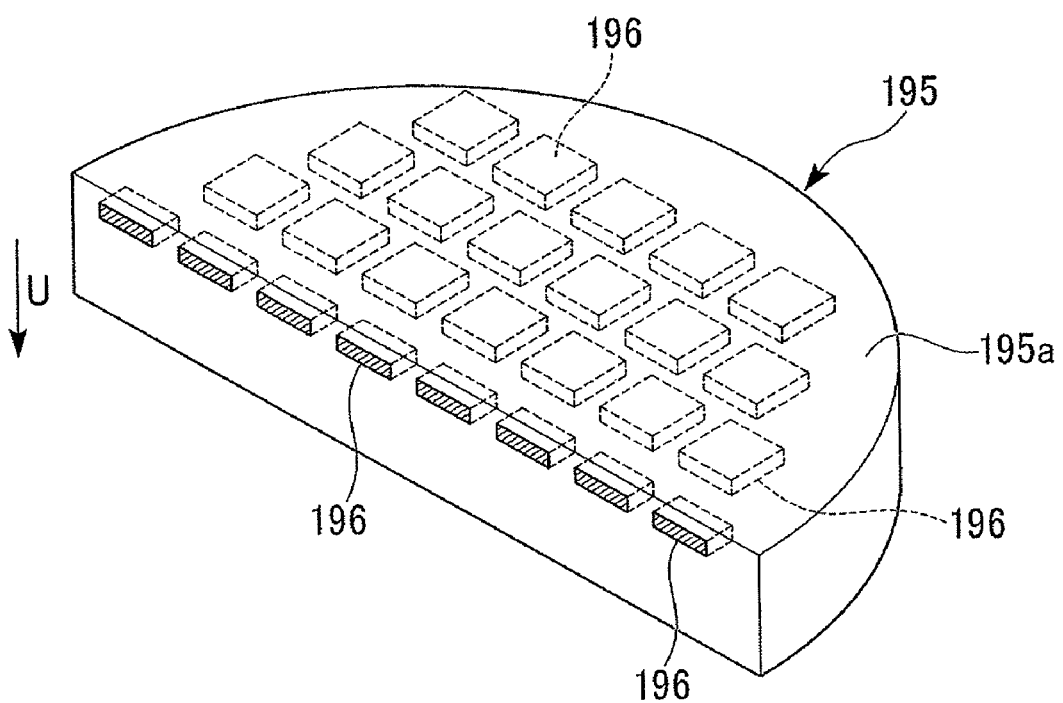

FIGS. 6A to 6B are exploded perspective diagrams illustrating an example of a shape of the gettering sink. In the semiconductor substrate 191 shown in FIG. 6A, the gettering sink 192 has a circular shape with respect to one surface 191a of the semiconductor substrate 191 and a 3-dimensional cylindrical shape extending in the thickness direction U of the semiconductor substrate 191. The gettering sink 192 having the cylindrical shape may have a diameter of 50 to 150 µm and a thickness of 10 to 150 µm.

Meanwhile, in the semiconductor substrate 195 shown in FIG. 6B, the gettering sink 196 has a rectangular shape with respect to one surface 195a of the semiconductor substrate 195 and a 3-dimensional parallelepiped shape extending in the thickness direction U of the semiconductor substrate 195. The gettering sink 196 may have a rectangular parallelepiped shape. One face of the gettering sink 196 having a rectangular shape which is parallel with one surface 195a of the semiconductor substrate 195 may have both a length and a width of 50 to 150 µm, and the gettering sink 196 may have a thickness of 10 to 150 µm.

Further, the gettering sink may have any 3-dimensional shape such as a cubic shape, an elliptical shape, and a spherical shape. In addition, it is preferable that a plurality of gettering sinks having such a 3-dimensional shape are provided in a position overlapped along the thickness direction U of the semiconductor substrate. As a result, it is possible to further improve a gettering capability of the heavy metals. In this case, a plurality of focal point positions of the laser beam may be set along the thickness direction U of the semiconductor substrate.

Second Aspect

Next, a method for manufacturing a semiconductor substrate dedicated to a semiconductor device and an apparatus for manufacturing a semiconductor substrate dedicated to a semiconductor device according to a second aspect of the present invention will be described. FIGS. 7A to 7D are cross-sectional views sequentially illustrating a method for manufacturing a solid-state imaging device as an example of the semiconductor device.

Figure 7A:
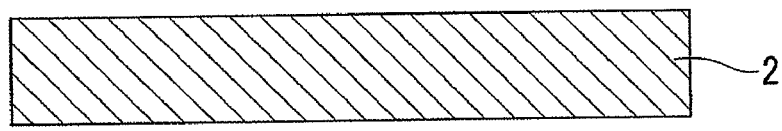
FIGS. 7A to 7D are cross-sectional views illustrating a method for manufacturing a semiconductor substrate dedicated to a semiconductor device according to a second aspect of the present invention.

In order to manufacture the semiconductor substrate dedicated to a semiconductor device (hereinafter, referred to as a semiconductor substrate), first, a single crystal wafer 2 is prepared (refer to FIG. 7A). The single crystal wafer 2 may be, for example, a single crystal silicon wafer manufactured by slicing a single crystal silicon ingot.

Figure 7B:
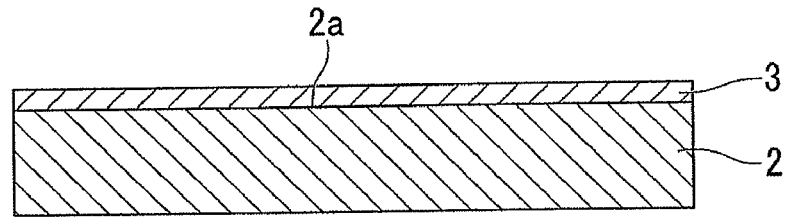

Next, for example, an epitaxial layer 3 is preferably formed on one surface 2a of this single crystal wafer 2 (refer to FIG. 7B: an epitaxial growth process). In the formation of the epitaxial layer 3, the epitaxial layer 3 including a single crystal silicon on one surface 2a may be grown by introducing raw gases while heating the single crystal wafer 2 in a predetermined temperature, for example, using an epitaxial growth apparatus.

Figure 7C:
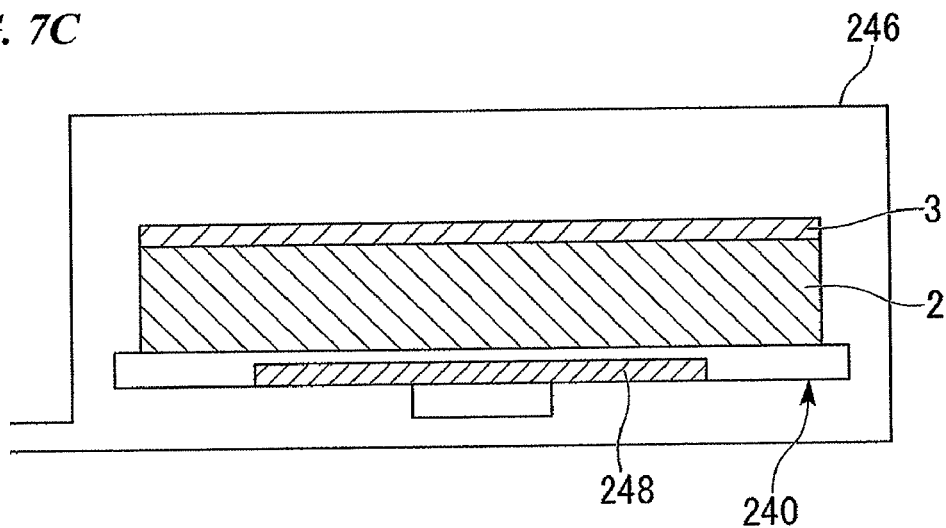

Next, as shown in FIG. 7C, the single crystal wafer 2 having the epitaxial layer 3 is mounted on the stage 240 provided in the chamber 246 of the laser irradiation apparatus 220. Then, the single crystal wafer 2 is heated in a predetermined temperature using the stage 240 by operating a stage heater (a substrate heating unit) 248 provided in the stage 240 (a substrate heating process).

The heating temperature for the single crystal wafer 2 at this moment is greater than or equal to 400° C. and less than or equal to 1000° C., and preferably, greater than or equal to 400° C. and less than or equal to 600° C.

Figure 7D:
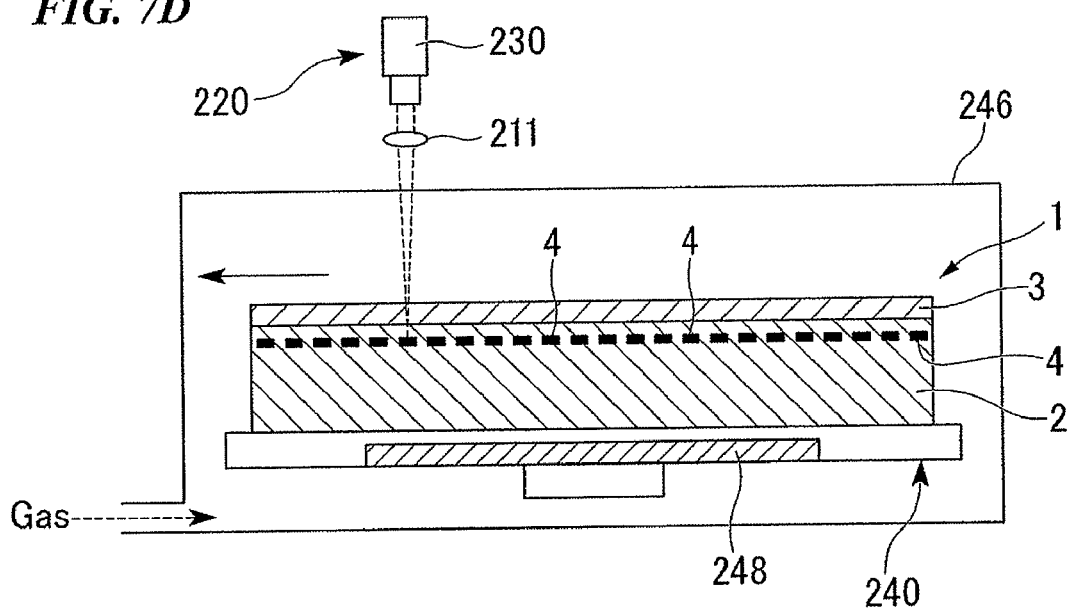

In addition, as shown in FIG. 7D, the laser beam is irradiated while moving the single crystal wafer 2 heated to a predetermined temperature by the stage heater (the substrate heating unit) 248 based on the imaging data of the CCD camera 230 (a gettering sink formation process). In this case, the laser beam output from the laser generator 215 (refer to FIG. 9) is condensed by the condensing lens (a condensing unit) 211 (refer to FIGS. 7D and 9) such that the condensing point (focal point) has a depth of several tens of μm from one surface 2a of the single crystal wafer 2. As a result, the crystal structure of the single crystal wafer 2 is reformed to provide a plurality of gettering sinks 4. In addition, a process of forming the gettering sink 4 will be described later.

In addition, in this gettering sink formation process, it is preferable that nitrogen, argon, hydrogen, or a mixture of them is filled in the chamber 246 storing the single crystal wafer 2 so that the internal space of the chamber 246 has a non-oxidizing gas atmosphere. As a result, it is possible to prevent a silicon oxidization film from being generated when oxygen in the air chemically reacts with the single crystal wafer due to the heat generated by irradiating the laser beam.

The semiconductor substrate (the semiconductor substrate dedicated to a semiconductor device) 1 obtained through the aforementioned process may be preferably used to manufacture, for example, a solid-state imaging device.

Figure 8A:
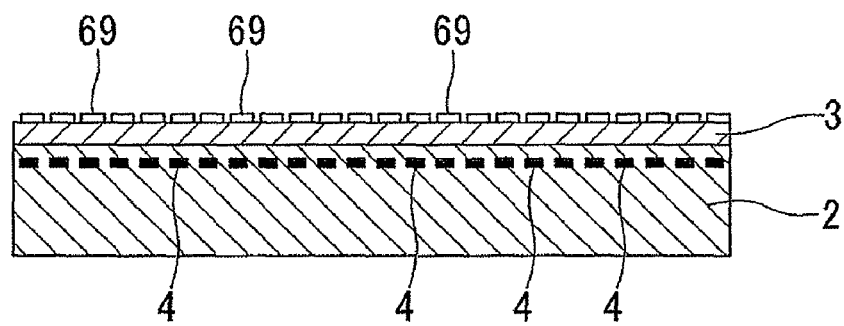
FIGS. 8A and 8B are cross-sectional views illustrating a method for manufacturing a semiconductor substrate dedicated to a semiconductor device according to a second aspect of the present invention.

As shown in FIG. 8A, a semiconductor device, for example, a plurality of photodiodes 69 (semiconductor device) is formed to overlap with the epitaxial layer 3 of the semiconductor substrate 1 (a device formation process). In this case, it is particularly preferable that each photodiode 69 is formed to overlap with each gettering sink 4.

Figure 8B:
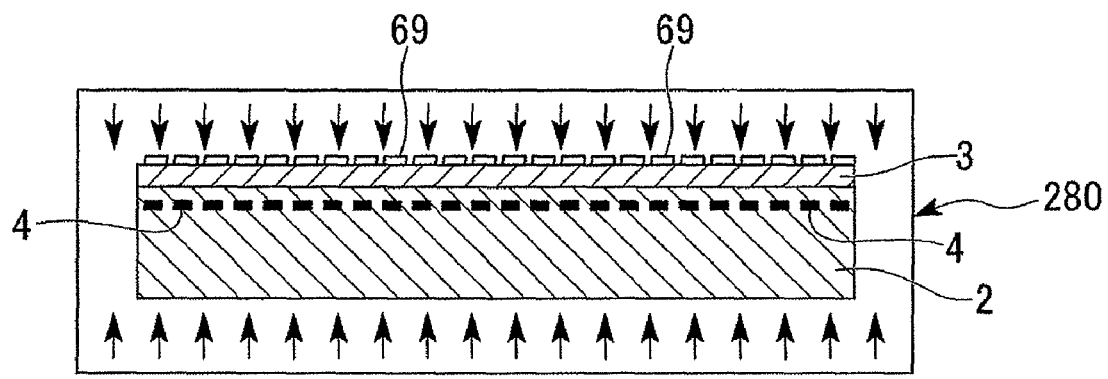

The semiconductor substrate 1 having the photodiode 69 is introduced into the annealer 280 and heated to a predetermined temperature (refer to FIG. 8B: a gettering process). As a result, heavy metals diffused in the single crystal wafer 2, particularly, heavy metals present in the area of the photodiode (a semiconductor device) are collected in the gettering sink 4. Therefore, it is possible to obtain a solid-state imaging device (a semiconductor device) having little leakage current caused by the heavy metals and excellent properties.

In addition, according to the present embodiment, while the gettering process is performed after forming the semiconductor device, the annealing may be previously performed before forming the semiconductor device to collect heavy metals in the gettering sink 4.

Figure 9:
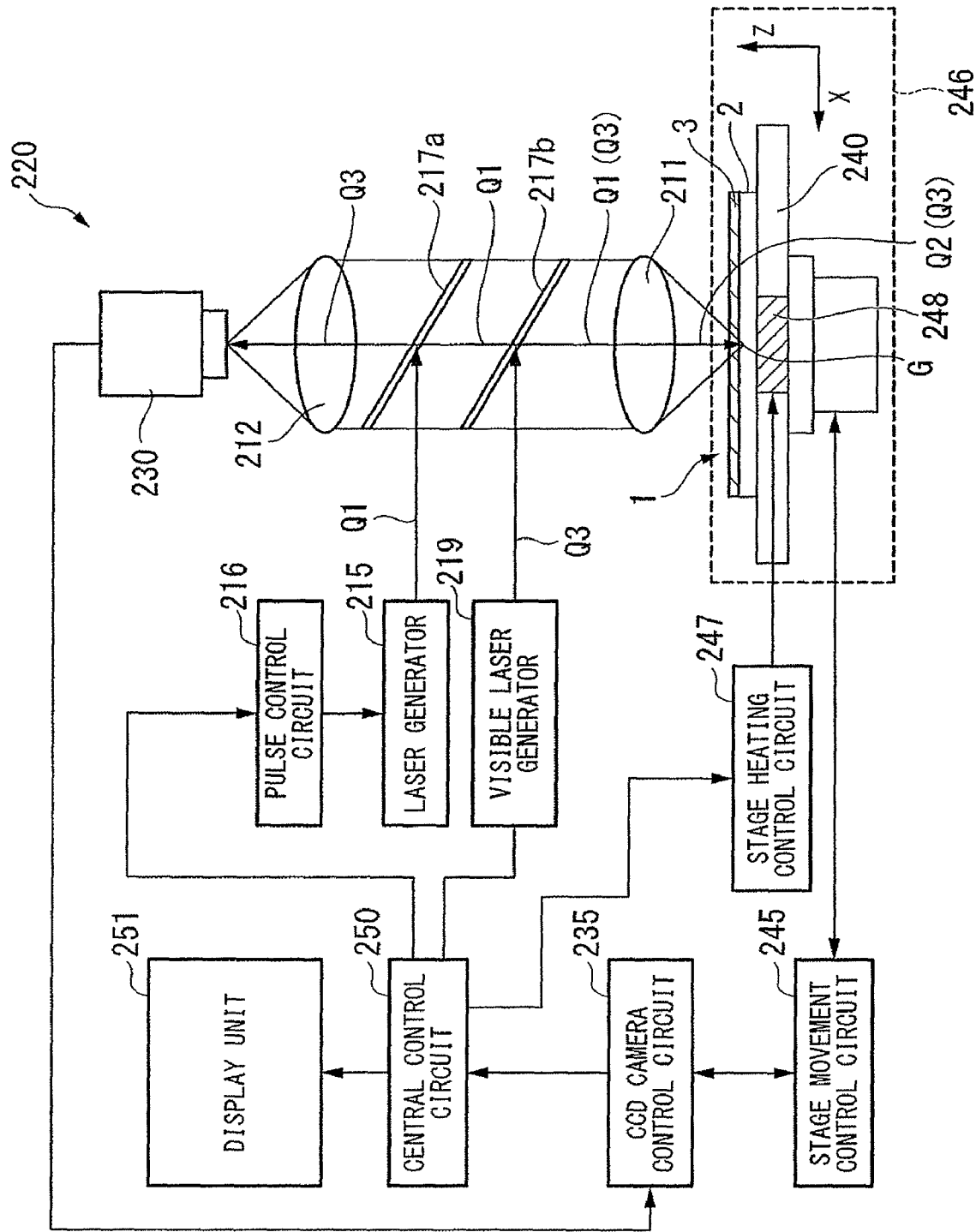
FIG. 9 is a schematic diagram illustrating an example of an apparatus for manufacturing a semiconductor substrate dedicated to a semiconductor device according to a second aspect of the present invention.

FIG. 9 is a schematic diagram illustrating an example of a laser irradiation apparatus for forming the gettering sink in the single crystal wafer according to a second aspect of the present invention. The laser irradiation apparatus 220 includes a laser generator 215 for pulse-oscillating the laser beam Q1, a pulse control circuit (Q-switch) 216 for controlling pulses such as the laser beam Q1, a beam splitter (half-mirror) 217a for reflecting the laser beam Q1 and changing the propagation direction of the laser beam Q1 by 90° toward the single crystal wafer 2, and a condensing lens (condensing unit) 211 for condensing the laser beam Q1 reflected by the beam splitter 217a.

Furthermore, the laser irradiation apparatus 220 includes a stage 240 for mounting the single crystal wafer 2 having the epitaxial layer 3. This stage 240 is controlled to move in a vertical direction Z and a horizontal direction X by the stage movement control circuit 245 to condense the laser beam Q2 into an arbitrary position of the single crystal wafer 2 and focus it on a focal point.

In addition, the stage 240 is provided with a stage heater (a substrate heating unit) 248 for heating the single crystal wafer 2 mounted on the stage 240. The temperature of the stage heater 248 is controlled by the stage heating control circuit 247. The stage heater 248 heats the single crystal wafer 2 such that the single crystal wafer 2 is heated to a predetermined temperature range during irradiation of the laser beam Q2. Preferably, a heating temperature range of the single crystal wafer 2 during irradiation of the laser beam Q2 is greater than or equal to 400° C. and less than or equal to 1000° C., and preferably, greater than or equal to 400° C. and less than or equal to 600° C.

The laser generator 215 and the pulse control circuit 216 are, but not limited thereto, configured to irradiate a laser beam capable of forming the gettering sink by reforming the crystal structure at any position inside the single crystal wafer. Particularly, it is preferable to use a titanium sapphire laser capable of oscillating in a short pulse period within a wavelength range capable of transmitting through the semiconductor wafer. In addition, as a preferable laser irradiation condition, the laser irradiation condition of Table 1 according to the first aspect of the invention may be used.

In addition, of the condition shown in Table 1, the pulse widths of the laser beams Q1 and Q2 are preferably set to $1.0 \times 10^{-14}$ to $1.0 \times 10^{-9}$ seconds, and more preferably, $1.0 \times 10^{-10}$ to $1.0 \times 10^{-9}$ seconds. The wavelengths of the laser beams Q1 and Q2 are preferably set to 1010 to 1090 nm, and more preferably, 1030 to 1060 nm.

Under the laser irradiation condition described above, the laser beams Q1 and Q2 can transmit through the semiconductor substrate.

The optical path width of the laser beam Q1 generated from the laser generator 215 is converged by the condensing lens 211. The stage 240 is controlled in a vertical direction Z such that the converged laser beam Q2 is focused (condensed) on the focal point G at an arbitrary depth D of the single crystal wafer 2. It is preferable that the condensing lens 211 has a magnification of 10 to 300 and a numerical aperture (N/A) of 0.3 to 0.9, and transmitivity for the wavelength of the laser beam is set to 30 to 60%.

The laser irradiation apparatus 220 further includes a visible laser generator 219, a beam splitter (half-mirror) 217b, a CCD camera 230, a CCD camera control circuit 235, a focusing lens 212, a central control circuit 250, and a display unit 251.

The visible laser beam Q3 generated from the visible laser generator 219 is reflected by the beam splitter (half-mirror) 217b and refracted by 90° so as to arrive at the epitaxial layer 3 of the single crystal wafer 2. Then, the visible laser beam Q3 is reflected by the surface of the epitaxial layer 3 and transmits through the condensing lens 211 and the beam splitters 217a and 217b so as to arrive at the focusing lens 212. The visible laser Q3 arriving at the focusing lens 212 is captured by the CCD camera 230 as a display image of the single crystal wafer 2, and the resultant imaging data are input to the CCD camera control circuit 235. The stage movement control circuit 245 controls the movement amount in the horizontal direction X of the stage 240 based on the input imaging data.

Figure 10:
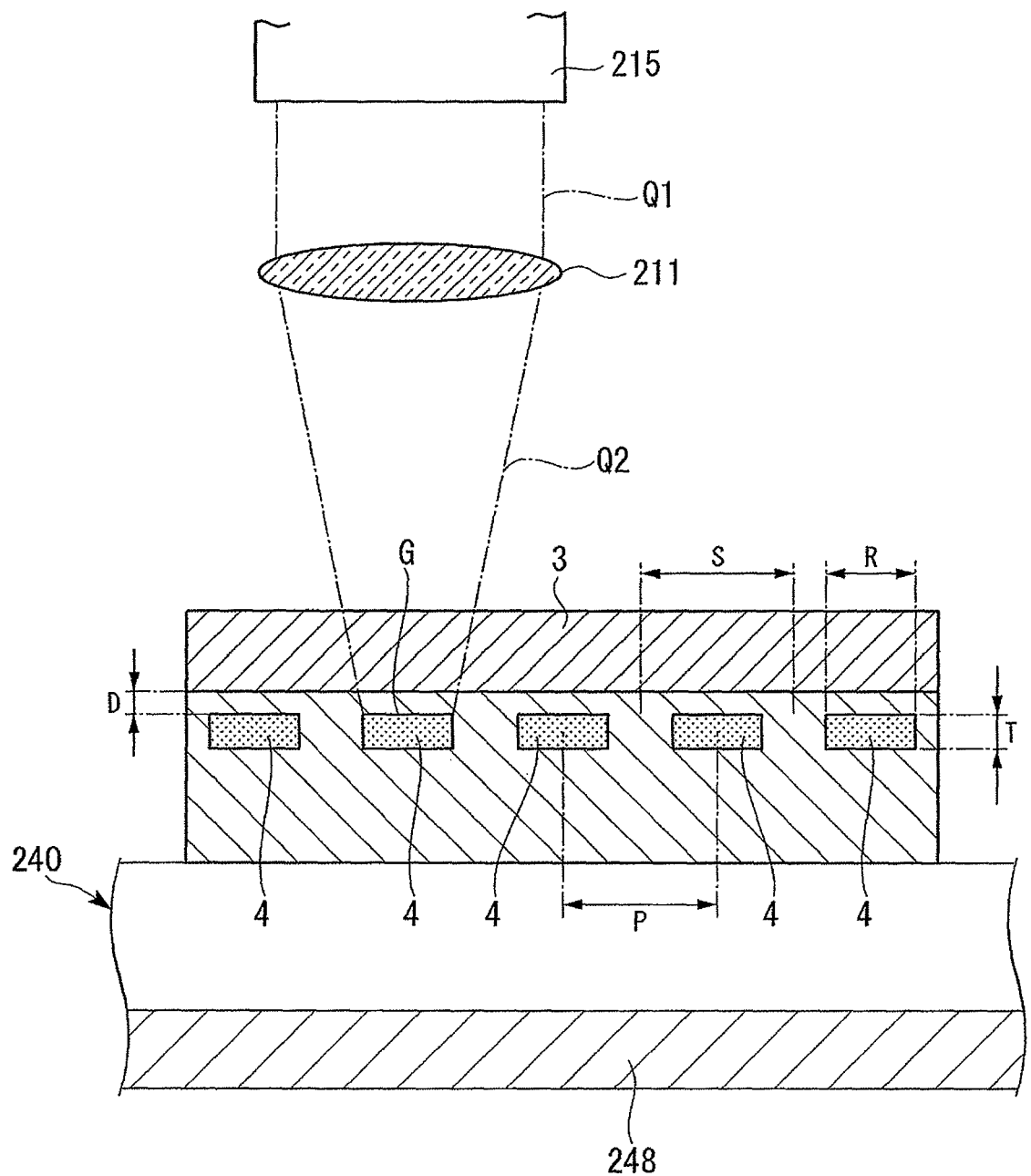
FIG. 10 is an enlarged cross-sectional view illustrating a process of forming a gettering sink according to a second aspect of the present invention.

Next, a method for forming the gettering sink on the single crystal wafer 2 having the epitaxial layer 3 will be described below. FIG. 10 is a schematic diagram illustrating how to form the gettering sink 4 on the semiconductor wafer using the laser beam. In order to form the gettering sink 4 on the single crystal wafer 2, the laser beam Q1 output from the laser generator 215 is converged by the condensing lens (condensing unit) 211. Since the converged laser beam Q2 has a wavelength range capable of transmitting through silicon, it arrives at the surface of the epitaxial layer 3 and then is incident thereto without reflection.

Meanwhile, the position of the single crystal wafer 2 having the epitaxial layer 3 is determined such that the condensing point (focal point) G of the laser beam Q2 has a predetermined depth D from one surface 2a of the single crystal wafer 2. As a result, the multi-photon absorption is generated in the area of the single crystal wafer 2 where only the condensing points (focal point) G of the laser beams Q2 are focused.

It is noted that, in the multi-photon absorption process, a large amount of energy is selectively absorbed only in the irradiation area by irradiating a large amount of photons onto a particular area (the irradiation area) within a short time. Therefore, a reaction occurs such that crystal binding at the irradiation area changes. According to a second aspect of the present invention, the semiconductor wafer of the single crystal structure is reformed at the condensing point (focal point), and a partially amorphous-like crystal structure is generated by condensing laser beams into an arbitrary area inside the single crystal wafer 2. Such reformation of the crystal structure may be performed as much as the heavy metals are trapped, i.e., weak deformation is generated in the crystal structure.

In addition, in such multi-photon absorption process using the laser beam Q2, the single crystal wafer 2 is heated by the stage heater 248 in a predetermined temperature range, for example, greater than or equal to 400° C. and less than or equal to 1000° C., and preferably, greater than or equal to 400° C. and less than or equal to 600° C. Therefore, it is possible to suppress an excessive temperature change caused by the condensed laser beam Q2 so as to prevent the temperature of the single crystal wafer 2 from locally rapidly rising or falling.

In the proximity of the condensing point G of the laser beam Q2, the temperature of the single crystal silicon instantaneously rises to a high temperature. Therefore, if the laser beam Q2 is incident to the single crystal wafer 2, for example, at a room temperature, a thermal shock wave is generated in the proximity of the condensing point, and internal stress is locally generated. Such internal stress is alleviated by a thermal process such as a subsequent device formation process, and a dislocation expands from the gettering sink that has been provided, so that a device characteristic may be degraded.

However, according to a second aspect of the present invention, the single crystal wafer 2 is previously heated by the stage heater 248 in a predetermined temperature range, for example, greater than or equal to 400° C. and less than or equal to 1000° C., and more preferably, greater than or equal to 400° C. and less than or equal to 600° C. Therefore, it is possible to maintain a small temperature difference between a highest temperature in the proximity of the condensing point and the temperature of the entire single crystal wafer 2 when the laser beam Q2 is incident. As a result, it is possible to prevent an abrupt temperature change accompanied by formation of the gettering site using the laser beam and suppress generation of internal stress. In addition, it is possible to form a semiconductor substrate dedicated to a semiconductor device in which a dislocation defect is hardly generated.

In addition, in the aforementioned embodiment, while the stage heater 248 was exemplified as a substrate heating unit, the present invention is not limited thereto, but any configuration capable of heating the single crystal wafer 2 in a predetermined temperature range may be used. For example, a substrate heating unit such as a lamp type heater or an electric wire heater for directly heating the single crystal wafer 2 may be provided at the areas other than the stage.

As described above, according to a second embodiment of the present invention, the irradiation position of the condensing point (focal point) G of the laser beam Q2 obtained by converging the laser beam Q1 is set in any micro-region inside the single crystal wafer 2. It is possible to form the gettering sink 4 in any micro-region of the single crystal wafer 2 by reforming the crystal structure of such a micro-region.

In the laser beam for forming the gettering sinks 4, it is important to set a condition capable of reliably transmitting the laser beam without reforming the crystal structure of the epitaxial layer 3 or the single crystal wafer 2 in the optical path before the laser beam arrives at the condensing point (focal point). Such an irradiation condition of the laser beam is determined by a forbidden band (an energy band gap) which is a basic material property of the semiconductor material. For example, since the forbidden band of a silicon semiconductor is 1.1 eV, when the incident wavelength is greater than or equal to 1000 nm, transmitivity becomes significant. As described above, the wavelength of the laser beam can be determined considering the forbidden band of the semiconductor material.

In a high output power laser such as a YAG laser used as the laser beam generator, a thermal energy may be transferred to neighboring areas thereof as well as to the positions having a predetermined depth. Therefore, a low output power laser, for example, an ultra-short pulsed-laser such as a femto-second laser is preferable.

The ultra-short pulsed-laser may be used to set the wavelength of the laser beam to any range by exciting the titanium sapphire crystals (solid-state laser crystals) using a semiconductor laser or the like. Since the ultra-short pulsed-laser can set a pulse width of the laser beam to be less than or equal to $1.0 \times 10^{-15}$ femto-seconds, it is possible to suppress diffusion of a thermal energy generated by excitation and concentrate the optical energy only on the condensing point (focal point) of the laser beam in comparison with other lasers.

It is estimated that the gettering sink 4 formed by reforming the crystal structure through the multi-photon absorption process has an amorphous-like crystal structure. In order to obtain such an amorphous-like crystal structure, it is necessary to locally rapidly heat and cool the areas where the condensing points (focal points) of the laser beams are focused. While the ultra-short pulsed-laser having the properties shown in Table 1 has a small energy amount, it can provide a sufficient energy to locally rapidly heat the single crystal wafer 2 by condensing laser beams using the condensing lens 211.

The temperature of the condensing point (focal point) of the laser beam reaches 9900 to 10000 K (9627 to 9727° C.). In addition, since the laser beams are condensed into the condensing point (focal point) G, a heat input range of the laser beam on the single crystal wafer 2 is significantly narrow. Therefore, if the condensing point (focal point) G moves by shifting the stage 240 where the single crystal wafer 2 is mounted or scanning laser beams, the heat input amount at the condensing point (focal point) before the movement is abruptly reduced so as to obtain a rapid cooling effect.

By setting the wavelength to 1000 nm as in the ultra-short pulsed-laser shown in Table 1, it is possible to increase transmitivity for the epitaxial layer 3 or the single crystal wafer 2, and reform only the micro-region of the condensing point (focal point) of the laser beam without affecting the crystal structure of the epitaxial layer 3 or the like. The reformed portion of the crystal structure may be preferably used as the gettering sink 4 of the semiconductor substrate 2.

In addition, if the wavelength of the laser beam is larger than 1200 nm, which is a long-wavelength range, the photon energy (laser beam energy) decreases. Therefore, it may be impossible to obtain a sufficient photon energy to internally reform the semiconductor even by condensing the laser beam, and thus, it is preferable that the wavelength of the laser beam be less than or equal to 1200 nm.

According to a second aspect of the present invention, the laser beam Q2 transmitting through the semiconductor wafer is condensed into the condensing point (focal point) G. Therefore, multi-photon absorption is generated in the condensing point (focal point) G.

A diameter of the laser beam at the condensing point (focal point) G is preferably greater than or equal to 1 μm and less than or equal to 10 mm, and more preferably, greater than or equal to 1 μm and less than or equal to 1 mm. The peak output density is preferably greater than or equal to $1.0 \times 10^6$ sec·W/cm$^2$ and less than or equal to $1.0 \times 10^{11}$ sec·W/cm$^2$, and more preferably, greater than or equal to $1.0 \times 10^7$ sec·W/cm$^2$ and less than or equal to $1.0 \times 10^{10}$ sec·W/cm$^2$. If the beam diameter and the peak output density at the condensing point (focal point) G satisfy the aforementioned conditions, it is possible to obtain the effect of multi-photon absorption.

The position of the condensing point (focal point) G of the laser beam, i.e., the position of forming the gettering sink 4 on the single crystal wafer 2 can be controlled by vertically or horizontally moving the stage 240. The position of the condensing point (focal point) G of the laser beam can also be controlled by controlling the position of the condensing unit (condensing lens) 211 in addition to the horizontal and vertical movement of the stage 240.

For example, when the gettering sink 4 is formed by reforming a depth of 2 μm from the surface of the semiconductor substrate, it is possible to form a reformation portion (gettering sink) by generating multi-photon absorption process by setting the wavelength of the laser beam to 1080 nm and focusing (condensing) the laser beam on a depth of 2 μm from the surface using a condensing lens (a magnification of 50) having transmissivity of 60%.

Figure 11:
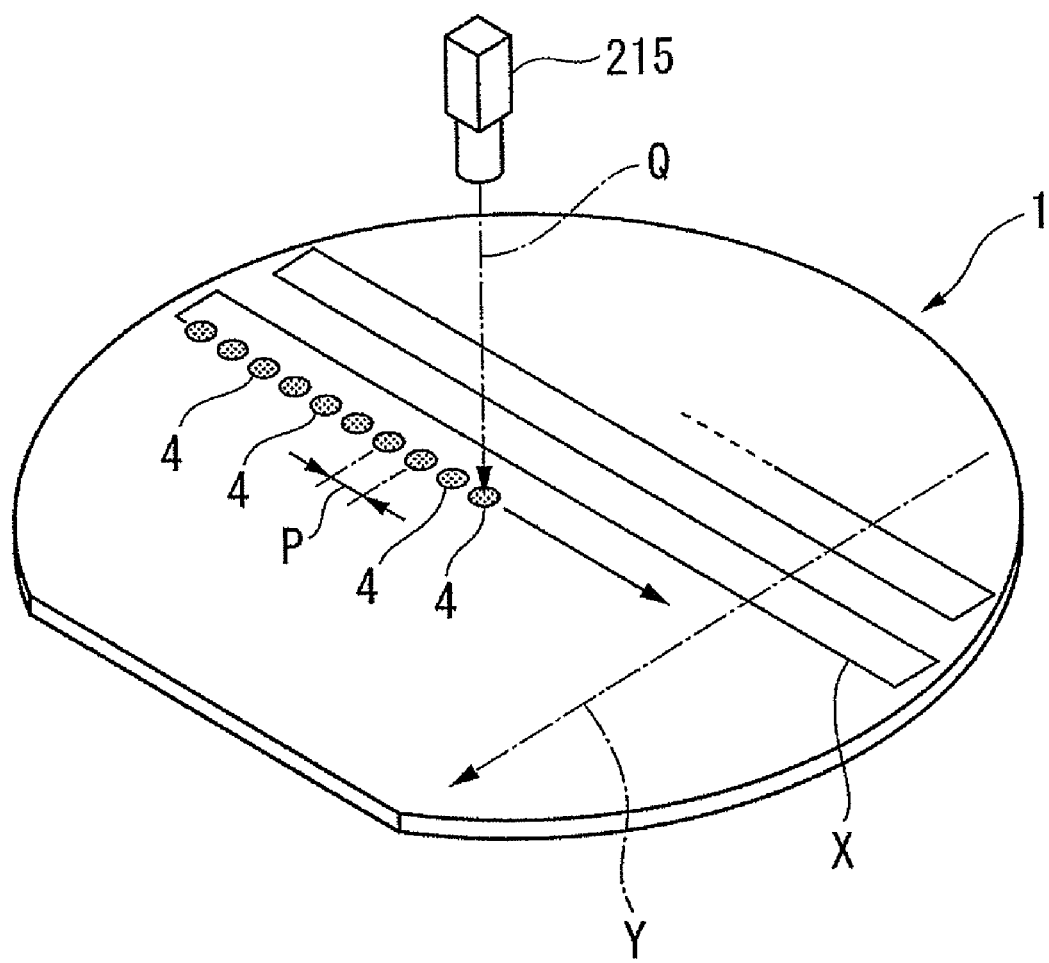
FIG. 11 is a perspective diagram illustrating an example of forming a gettering sink according to a second aspect of the present invention.

The arrangement and the shape of the gettering sinks 4 can be controlled by scanning the laser beam along one surface of the single crystal wafer 2 or horizontally adjusting the stage. FIG. 11 is a schematic diagram illustrating how to form the gettering sink in the semiconductor substrate. The gettering sink 4 may be foamed under the device formation area of the semiconductor substrate. For example, the laser beam Q is scanned on the entire area of the other surface (back surface) of the single crystal wafer 2 having a device. Specifically, the entire surface of the single crystal wafer 2 is scanned by turning the laser scanning position to a direction Y perpendicular to the horizontal direction X as well as in parallel with the surface of the single crystal wafer 2 at an edge of the single crystal wafer 2 while scanning the laser beam Q in a horizontal direction X. It is possible to fowl a plurality of gettering sinks 4 on the entire single crystal wafer 2 by irradiating the laser beam Q under a predetermined condition.

The distribution density of the gettering sinks 4 may be set by a scanning pitch P of the laser beam Q. For example, the range of the distribution density of the gettering sinks 4 is preferably set to $1.0 \times 10^5$ to $1.0 \times 10^6$ gettering sinks/cm$^2$. The distribution density of the gettering sinks 4 can be verified based on the number of oxygen precipitates obtained by observing a cross-section TEM (Transmission Electron Microscope).

While, in the aforementioned embodiment, the gettering sinks 4 are formed while moving the single crystal wafer 2 using the laser beam having a single optical axis as a method for irradiating the laser beam, for example, the laser beams having a plurality of optical axes may be simultaneously (concurrently) irradiated. As an example of the laser beam source used in such a configuration, a plurality of laser diodes may be arranged in a multifaceted shape, and a plurality of gettering sinks may be simultaneously formed by a single irradiation.

Third Aspect

Next, a method for manufacturing a semiconductor substrate dedicated to a semiconductor device and a method for manufacturing a semiconductor device using the same according to a third aspect of the present invention will be described. FIGS. 12A to 12E are cross-sectional views sequentially illustrating a method for manufacturing a solid-state imaging device as an example of the semiconductor device.

Figure 12A:
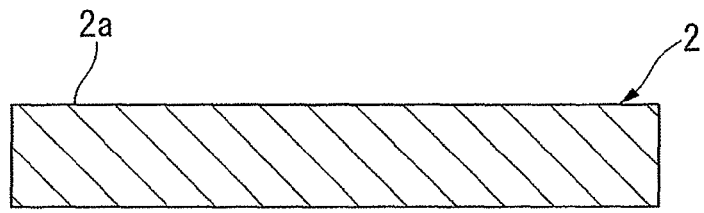
FIGS. 12A to 12E are cross-sectional views illustrating a method for manufacturing a semiconductor substrate dedicated to a semiconductor device according to a third aspect of the present invention.

In order to manufacture a solid-state imaging device (semiconductor device), first, a single crystal wafer 2 is prepared (refer to FIG. 12A). The single crystal wafer 2 may be, for example, a single crystal silicon wafer manufactured by slicing a single crystal silicon ingot.

Figure 12B:
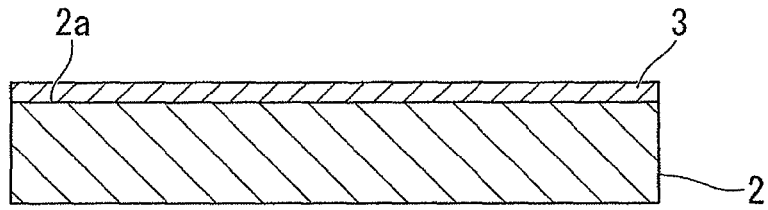
Figure 12C:
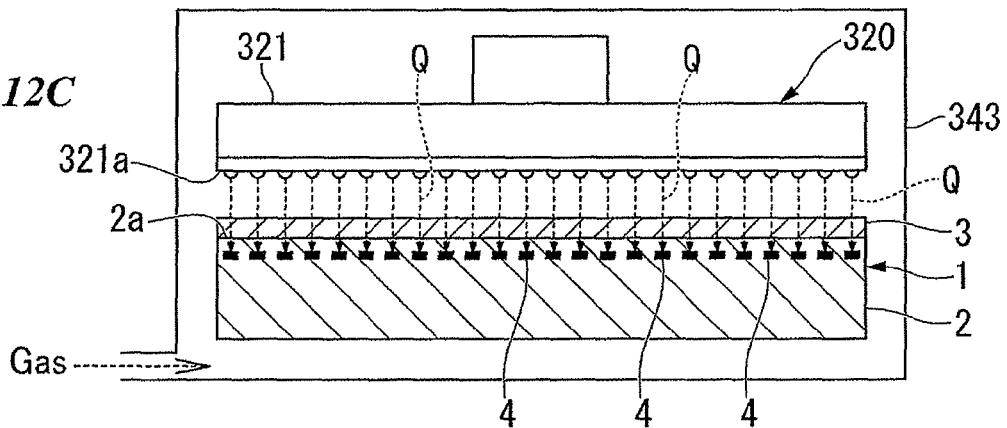

Next, an epitaxial layer 3 is preferably formed on one surface 2a of this single crystal wafer 2 (refer to FIG. 12B: an epitaxial growth process). In the formation of the epitaxial layer 3, the epitaxial layer 3 including a single crystal silicon on one surface 2a of the single crystal wafer 2 may be grown by introducing raw gases while heating the single crystal wafer 2 in a predetermined temperature, for example, using an epitaxial growth apparatus.

Next, the single crystal wafer 2 having the epitaxial layer 3 is set in the laser irradiation apparatus 320, and the laser beam is irradiated to one surface 2a of the single crystal wafer 2 (refer to FIG. 12). In this case, as shown in FIG. 13, a plurality of lines of laser beams Q are simultaneously irradiated toward one surface 2a of the single crystal wafer 2 along a plurality of optical axes C arranged in parallel with one another from the irradiation surface 321a of the laser irradiator 321 included in the laser irradiation apparatus 320.

A plurality of laser beams Q simultaneously output from the irradiation surface 321a of the laser irradiator 321 are previously condensed such that the condensing point (focal point) is positioned under a depth of several tens of μm from one surface 2a of the single crystal wafer 2 using a condensing unit (not shown) such as a condensing lens. As a result, the crystal structure of the single crystal wafer 2 is reformed, and a plurality of gettering sinks 4 are simultaneously formed by a single irradiation (a gettering sink formation process).

In addition, in this gettering sink formation process, it is preferable that nitrogen, argon, hydrogen, or a mixture thereof is filled in the chamber 343 for storing the single crystal wafer 2 so that the internal space of the chamber 343 has a non-oxidizing gas atmosphere. As a result, it is possible to prevent a silicon oxidization film from being generated when oxygen in the air chemically reacts with the single crystal wafer 2 due to the heat generated by irradiating the laser beam Q.

Through the aforementioned process, it is possible to obtain a semiconductor substrate 1 dedicated to a semiconductor device according to the present invention. A semiconductor device is manufactured using the semiconductor substrate 1 including the single crystal wafer 2 having the epitaxial layer 3 and the gettering sink 4.

Figure 12D:
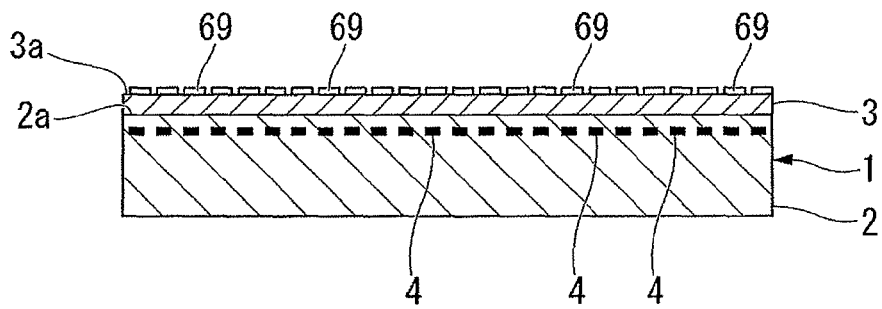
Figure 13:
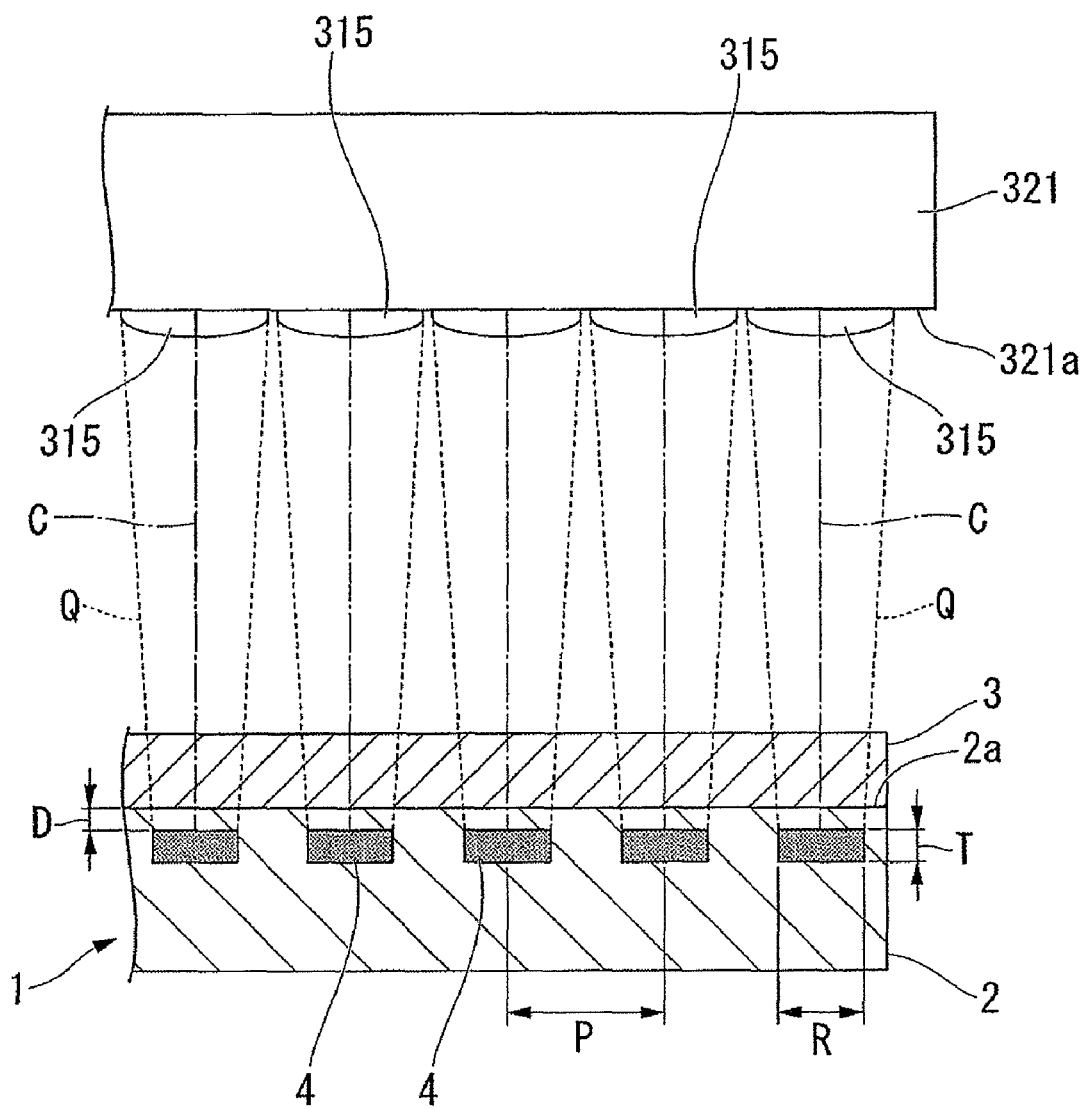
FIG. 13 is an enlarged cross-sectional view illustrating a process of forming a gettering sink according to third aspect of the present invention.

As shown in FIG. 12D, a plurality of semiconductor devices, for example, photodiodes 69 are arranged on one surface 3a of the epitaxial layer 3 of the semiconductor substrate 1 (a device formation process). The photodiodes (semiconductor device) 69 may be configured as shown in FIG. 2 described above. In this case, each photodiode (semiconductor device) 69 may be formed in a position overlapped with each gettering sink 4.

Figure 12E:
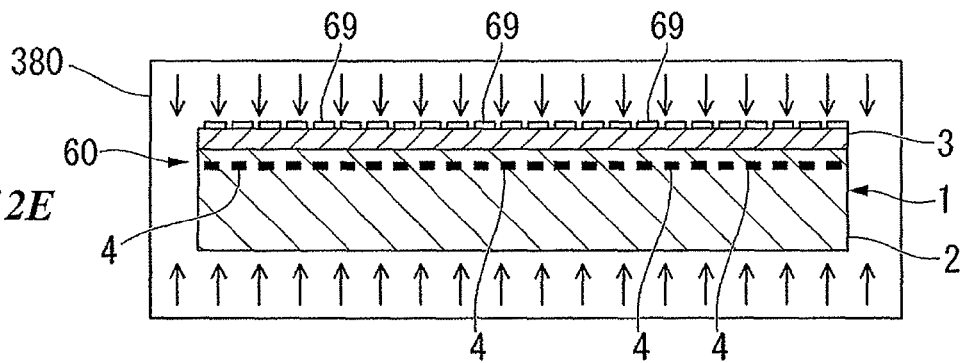

As shown in FIG. 12E, the semiconductor substrate 1 having a plurality of photodiodes (semiconductor devices) 69 is introduced into the annealer 380 and heated to a predetermined temperature (a gettering process). As a result, the heavy metals diffused within the single crystal wafer 2 are collected in the gettering sinks 4, and it is possible to obtain a solid-state imaging device (semiconductor device) 60 having few heavy metals in the device formation area, i.e., the area where the photodiodes (semiconductor device) 69 are formed.

Figure 14:
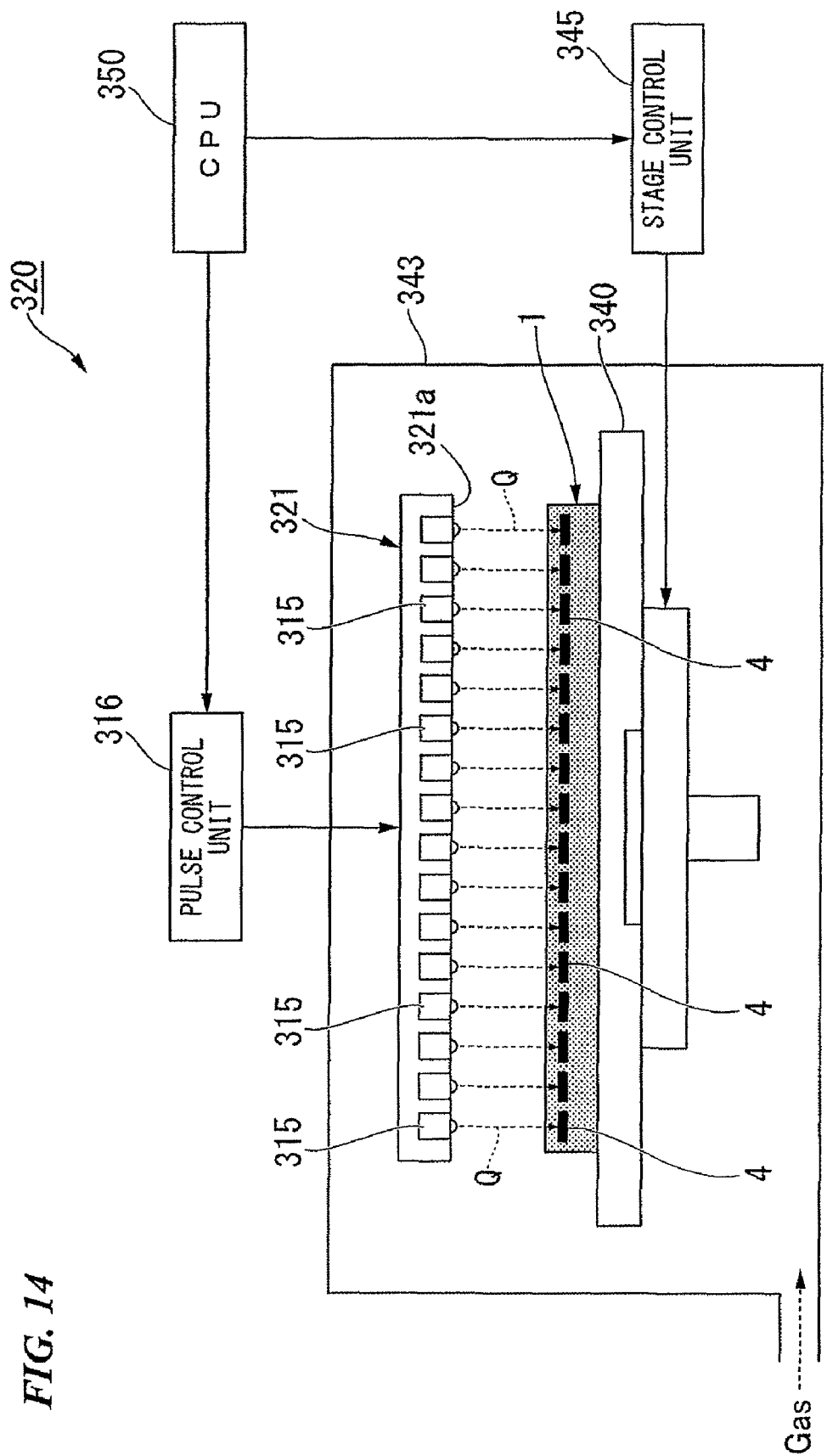
FIG. 14 is a schematic diagram illustrating an example of an apparatus for manufacturing a semiconductor device according to a third aspect of the present invention.

FIG. 14 is a schematic diagram illustrating an apparatus for manufacturing a semiconductor device according a third embodiment of the present invention, i.e., an example of a laser irradiation apparatus for forming a gettering sink on a semiconductor wafer. The laser irradiation apparatus (an apparatus for manufacturing a semiconductor device) 320 has a laser irradiator 321 for irradiating laser beams onto the semiconductor substrate 1 along a plurality of optical axes C parallel with one another from the irradiation surface 321a.

The laser irradiator 321 is formed, for example, in an approximately disc shape having an approximately circular bottom surface greater than or equal to the single crystal wafer 2. Along the irradiation surface 321a facing the single crystal wafer 2, a plurality of laser sources such as laser diodes 315 are provided.

Figure 15:
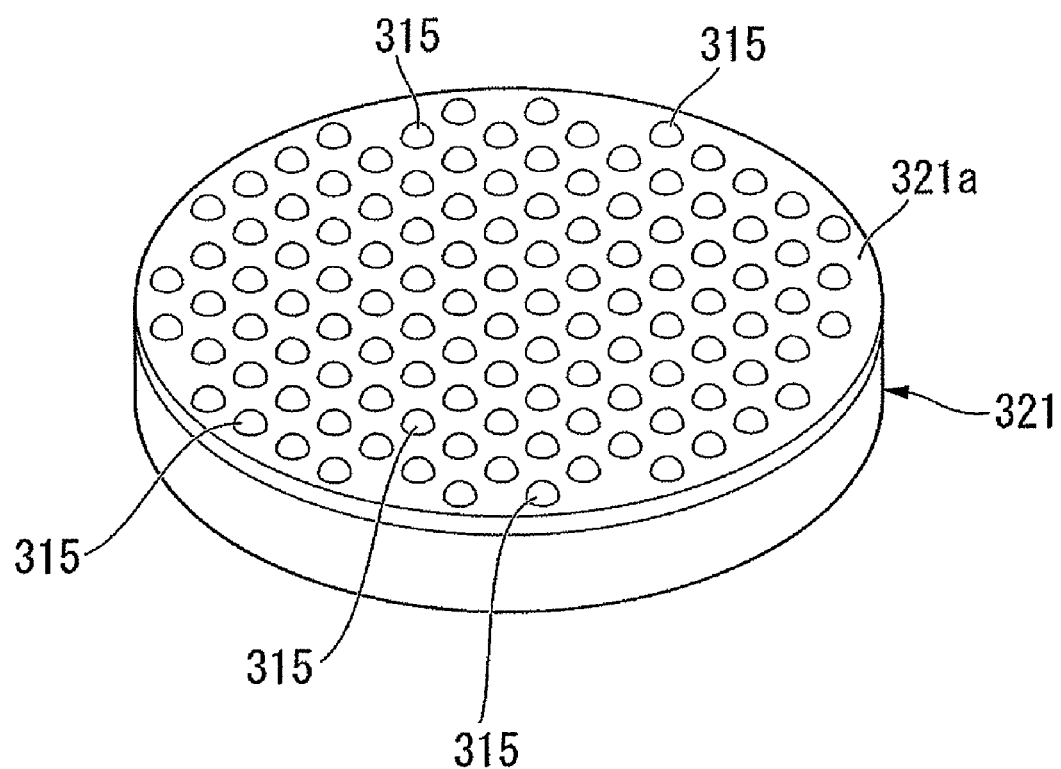
FIG. 15 is a perspective diagram illustrating an example of a laser irradiator according to a third aspect of the present invention.

As shown in FIG. 15, the laser diodes 315 are regularly arranged to be spread over an approximately circular irradiation surface 321a. The position of forming each laser diode 315 may be set to match (overlap) with, for example, each position of forming the semiconductor device on the semiconductor substrate 1.

Returning to FIG. 14, the laser irradiation apparatus 320 is provided with a stage 340 for mounting the single crystal wafer 2 and a chamber 343 for hermetically storing the stage 340 or the laser irradiator 321. Furthermore, the laser irradiation apparatus 320 includes a pulse control unit 316 for controlling oscillation of the laser beam irradiated from the laser irradiator 321.

Furthermore, the laser irradiation apparatus 320 includes stage control unit 345 for controlling a position (a depth) of forming the gettering sink 4 by controlling a distance between the single crystal wafer 2 and the irradiation surface 321a of the laser irradiator 321 by vertically moving the stage 340. Furthermore, the laser irradiation apparatus 320 has a CPU 350 for controlling a laser irradiation apparatus 320 including the stage control unit 345 or the pulse control unit 316.

A plurality of laser diodes 315 may be configured, but is not limited thereto, so as to irradiate a laser beam having a wavelength range capable of forming the gettering sink by reforming the crystal structure at an arbitrary position within the single crystal wafer 2.

In addition, a preferable laser irradiation condition may include the laser irradiation condition shown in Table 1 according to the first aspect of the present invention.

Of the condition shown in Table 1, the pulse widths of the laser beams Q1 and Q2 are set to, preferably, $1.0 \times 10^{-14}$ to $1.0 \times 10^{-9}$ seconds, and more preferably, $1.0 \times 10^{-10}$ to $1.0 \times 10^{-9}$ seconds. The wavelengths of the laser beams Q1 and Q2 are set to, preferably, 1010 to 1090 nm, and more preferably, 1030 to 1060 nm.

Under the aforementioned laser irradiation condition, the laser beams Q1 and Q2 can transmit through the semiconductor substrate.

Next, a method for forming the gettering sink 4 on a single crystal wafer 2 having the epitaxial layer 3 will be described in detail. FIGS. 13 and 14 are schematic diagrams illustrating how to form the gettering sink 4 on the semiconductor wafer using a laser beam.

In order to form the gettering sink 4 on the single crystal wafer 2, the single crystal wafer 2 having the epitaxial layer 3 is mounted on the stage 340 of the laser irradiation apparatus 320. Then, a plurality of laser beams Q are simultaneously irradiated onto one surface 2a of the single crystal wafer 2 from a plurality of laser diodes 315 arranged along the irradiation surface 321a of the laser irradiator 321.

Each laser beam Q may be an ultra-short pulsed-laser beam having, for example, a pulse width range of $1.0 \times 10^{-15}$ to $1.0 \times 10^{-8}$ seconds and a wavelength of 300 to 1200 nm. Since such a laser beam Q has a wavelength range capable of transmitting through silicon, it arrives at the surface of the epitaxial layer 3 and then is directly incident thereto without reflection.

Meanwhile, the position of the single crystal wafer 2 having the epitaxial layer 3 is determined by controlling a height of the stage 340 such that the condensing point (focal point) G of the laser beam Q2 has a predetermined depth D from one surface 2a of the single crystal wafer 2. As a result, the multi-photon absorption is generated in only the area of the single crystal wafer 2 where the condensing points (focal points) G of the laser beams G are focused. In addition, the condensing point of this laser beam Q, i.e., the position where the gettering sink 4 is formed, is preferably controlled such that the peak output density of the laser beam Q has a range of $1.0 \times 10^{6}$ to $1.0 \times 10^{11}$ sec·W/cm$^2$.

It is noted that, in the multi-photon absorption process, a large amount of energy is selectively absorbed only in the irradiation area by irradiating a large amount of photons onto a particular area (the irradiation area) within a short time. Therefore, reaction occurs such that crystal binding at the irradiation area changes.

According to a third aspect of the present invention, the semiconductor wafer of the single crystal structure is reformed at the condensing point (focal point), and a partially amorphous-like crystal structure is generated by condensing laser beams into an arbitrary area inside the single crystal wafer 2. Such reformation of the crystal structure may be performed as much as the heavy metals are trapped, i.e., weak deformation is generated in the crystal structure.

As describe above, it is possible to form a plurality of gettering sinks 4 in any micro-region of the single crystal wafer 2 by setting the condensing point (focal point) of the laser beam Q in any micro-region inside the single crystal wafer 2 and reforming the crystal structure of this micro-region.

In this gettering sink formation process, it is preferable that nitrogen, argon, hydrogen, or a mixture of them is filled in the chamber 343 (refer to FIG. 14) storing the single crystal wafer 2 so that the internal space of the chamber 343 has a non-oxidizing gas atmosphere. As a result, it is possible to prevent a silicon oxidization film from being generated when oxygen in the air chemically reacts with the single crystal wafer due to the heat generated by irradiating the laser beam.

In the laser beam Q for forming the gettering sinks 4, it is important to set a condition capable of reliably transmitting the laser beam without reforming the crystal structure of the epitaxial layer 3 or the single crystal wafer 2 in the optical path before the laser beam Q arrives at the condensing point (focal point).

Such an irradiation condition of the laser beam is determined by a forbidden band (an energy band gap) which is a basic material property of the semiconductor material. For example, since the forbidden band of a silicon semiconductor is 1.1 eV, when the incident wavelength is greater than or equal to 1000 nm, transmitivity becomes significant. As described above, the wavelength of the laser beam can be determined considering the forbidden band of the semiconductor material.

An ultra-short pulsed-laser such as a femto-second laser is preferably used as the laser beam Q. Since the ultra-short pulsed-laser can set a pulse width of the laser beam to be less than or equal to $1.0 \times 10^{-15}$ femto-seconds, it is possible to suppress diffusion of a thermal energy generated by excitation and concentrate the optical energy only on the condensing point (focal point) of the laser beam in comparison with other lasers.

It is estimated that the gettering sink 4 formed by reforming the crystal structure through the multi-photon absorption process has an amorphous-like crystal structure. In order to obtain such an amorphous-like crystal structure, it is necessary to locally heat and cool the areas rapidly where the condensing points (focal points) G of the laser beams Q are focused. The ultra-short pulsed-laser having the properties shown in Table 1 can provide a sufficient energy to locally heat the single crystal wafer 2 rapidly by condensing the laser beams using the condensing unit.

The temperature of the condensing point (focal point) G of the laser beam reaches 9900 to 10000 K (9627 to 9727° C.). In addition, since the laser beams are condensed into the condensing point (focal point) G, a heat input range of the laser beam on the single crystal wafer 2 is significantly narrow. Therefore, if the irradiation stops after a short time, the heat input amount at the condensing point (focal point) G is abruptly reduced so as to obtain a rapid cooling effect.

By setting the wavelength to 1000 nm as in the ultra-short pulsed-laser shown in Table 1, it is possible to increase transmitivity for the epitaxial layer 3 or the single crystal wafer 2, and reform only the micro-region at the condensing point (focal point) of the laser beam without affecting the crystal structure of the epitaxial layer 3 or the like. The reformed portion of the crystal structure may be preferably used as the gettering sink 4 of the single crystal wafer 2.

In addition, if the wavelength of the laser beam is larger than 1200 nm, which is a long-wavelength range, the photon energy (laser beam energy) decreases. Therefore, it may be impossible to obtain a sufficient photon energy to internally reform the semiconductor substrate even by condensing the laser beam, and thus, it is preferable that the wavelength of the laser beam is less than or equal to 1200 nm.

According to a third aspect of the present invention, the laser beam Q transmitting through the semiconductor wafer is condensed into the condensing point (focal point) G. Therefore, multi-photon absorption is generated in the condensing point (focal point) G.

A diameter of the laser beam at the condensing point (focal point) G is preferably greater than or equal to 1 μm and less than or equal to 10 mm, and more preferably, greater than or equal to 1 μm and less than or equal to 1 mm. The peak output density is preferably greater than or equal to $1.0 \times 10^{6}$ sec·W/cm$^2$ and less than or equal to $1.0 \times 10^{11}$ sec·W/cm$^2$, and more preferably, greater than or equal to $1.0 \times 10^{7}$ sec·W/cm$^2$ and less than or equal to $1.0 \times 10^{10}$ sec·W/cm$^2$. If the beam diameter and the peak output density at the condensing point (focal point) G satisfy the aforementioned conditions, it is possible to obtain the effect of multi-photon absorption.

The position of the condensing point (focal point) G of the laser beam, i.e., the position of forming the gettering sink 4 on the single crystal wafer 2 can be controlled by vertically moving the stage 340. The position of the condensing point (focal point) G of the laser beam can also be controlled by controlling the position of the condensing unit (not shown) in addition to the vertical movement of the stage 340.

For example, when the gettering sink 4 is formed by reforming a depth of 2 μm from the surface of the semiconductor substrate, it is possible to form a reformation portion (gettering sink) by generating multi-photon absorption process by setting the wavelength of the laser beam to 1080 nm and focusing (condensing) the laser beam on a depth of 2 μm from the surface using a condensing lens (a magnification of 50) having transmitivity of 60%.

As described above, the gettering sink 4 obtained by reforming the crystal structure of the micro-region of the single crystal wafer 2 may be formed in a disc shape having a diameter R of 50 to 150 μm and a thickness T of 10 to 150 μm. The depth D of the formed gettering sink 4 is preferably set to 0.5 to 2 μm from one surface 2a of the single crystal wafer 2.

Each gettering sink 4 may be formed at positions overlapped with at least an area S for forming the solid-state imaging device in the semiconductor substrate 1. The gettering sinks 4 may be spaced with a pitch P of, for example, 0.1 μm to 10 mm.

The distribution density of the gettering sinks 4 in the entire semiconductor substrate 1 is determined by the distribution density (spacing) of a plurality of laser diodes 315 arranged on the irradiation surface 321a of the laser irradiator 321 included in the laser irradiation apparatus 320.

For example, it is possible to increase the distribution density of the gettering sinks 4 by densely arranging smaller laser diodes. In addition, it is possible to increase the distribution density of the gettering sinks 4 by accurately adjusting the single crystal wafer 2 within a range smaller than the pitch P of the laser diodes 315 after a single irradiation of the laser and then performing the laser irradiation again.

For example, the distribution density range of the gettering sinks 4 is preferably set to $1.0 \times 10^{5}$ to $1.0 \times 10^{7}$ gettering sinks/cm$^2$. The distribution density of the gettering sinks 4 can be verified based on the number of oxygen precipitates obtained by observing a cross-section TEM (Transmission Electron Microscope).

As described above, according to a method for manufacturing a semiconductor substrate dedicated to a semiconductor device of the present invention, multi-photon absorption is generated in the micro-region inside the semiconductor substrate by condensing laser beams into any micro-region inside the semiconductor substrate, and it is possible to readily faun the gettering sink by changing only the crystal structure of the corresponding micro-region.

In the process of forming the gettering sink according to a third embodiment of the present invention, a plurality of laser beams are simultaneously (concurrently) irradiated from the irradiation surface along a plurality of optical axes parallel to one another. Therefore, it is possible to simultaneously form a plurality of gettering sinks within a significant short time in comparison with a method for irradiating a single laser beam or irradiating laser beams while shifting the semiconductor substrate. In addition, even in the case of a large-sized single crystal wafer such as a 300 mm wafer or a 450 mm wafer, a plurality of gettering sinks can be formed in a batch process without increasing the time for forming the gettering sink by increasing the number of laser sources formed along the irradiation surface.

By applying a method for manufacturing a semiconductor substrate dedicated to a semiconductor device according to a third aspect to a method for manufacturing a semiconductor device, it is possible to faun a plurality of gettering sinks within a short time. In other words, it is possible to readily manufacture a high performance semiconductor device, in which heavy metals are reliably trapped, within a short time.

Figure 16:
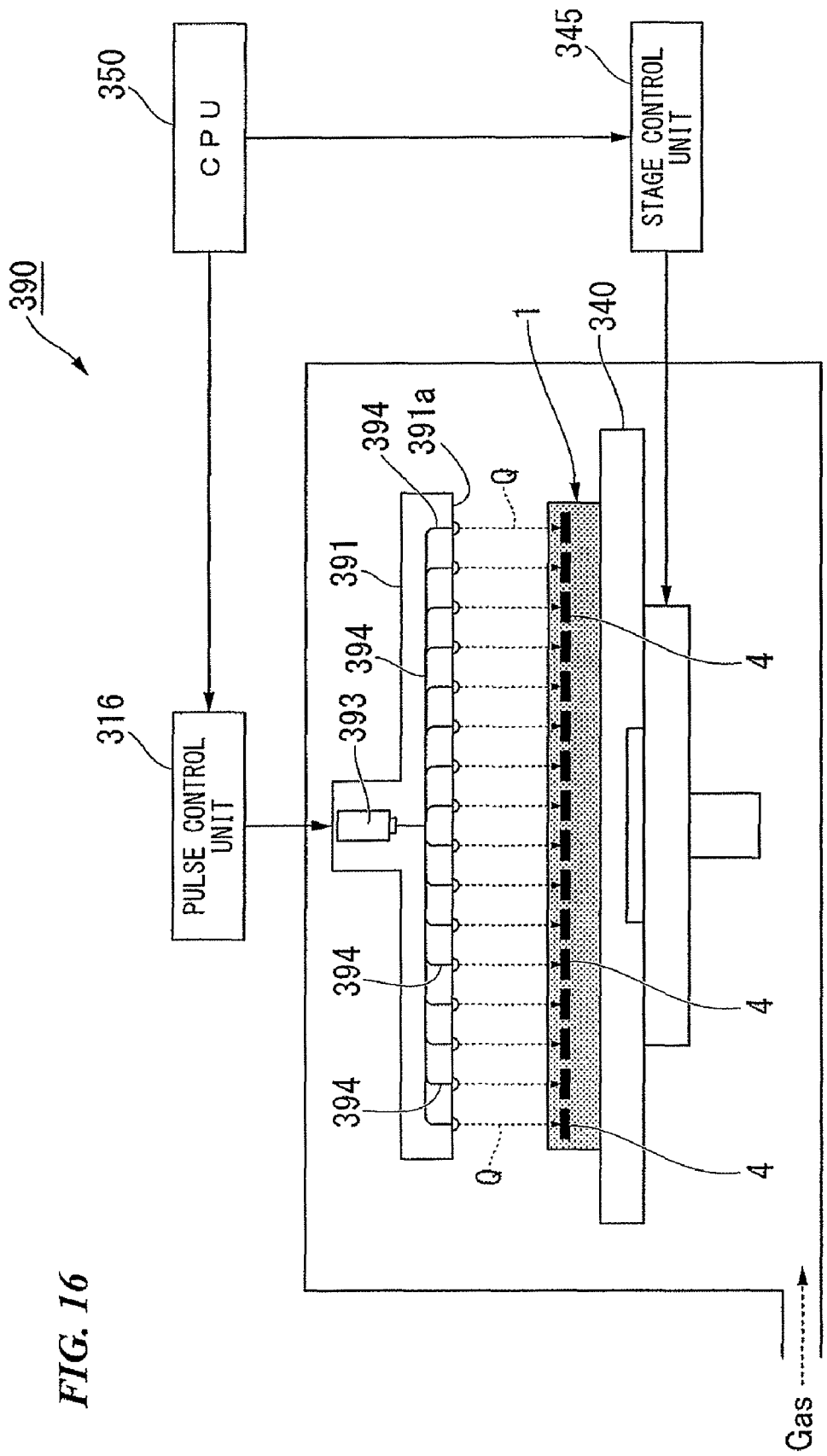
FIG. 16 is a schematic diagram illustrating another example of an apparatus for manufacturing a semiconductor device according to a third aspect of the present invention.

FIG. 16 is a schematic diagram illustrating another example of an apparatus for manufacturing a semiconductor device, i.e., a laser irradiation apparatus for forming a gettering sink on a semiconductor wafer according to the present invention. In addition, like reference numerals denote like elements as the laser irradiation apparatus shown in FIG. 14, and descriptions thereof will be omitted.

This laser irradiation apparatus (the apparatus for manufacturing a semiconductor device) 390 includes a laser irradiator 391 for irradiating laser beams onto the semiconductor substrate 1 along a plurality of optical axes C parallel to one another from the irradiation surface 391a.

The laser irradiator 391 includes a pulse laser device 393 as a laser source such as a femto-second laser and a plurality of optical guiding members (optical fibers) 394 extending from the pulse laser device 393 to the irradiation surface 391a. Each optical guiding member 394 has one end connected to the pulse laser device 393 and the other end connected to the irradiation surface 391a.

In such a configuration, the laser beam output from a single pulse laser device 393 propagates to the irradiation surface 391a through each of the optical guiding members (optical fiber). Then, it is possible to simultaneously form a plurality of gettering sinks 4 by irradiating a plurality of laser beams Q onto the semiconductor substrate 2 from the irradiation surface 391a along a plurality of optical axes parallel to one another.

In the laser irradiation apparatus (an apparatus for manufacturing a semiconductor device) 390 having such a configuration, the laser beam irradiated from a single pulse laser device (laser source) is divided by the optical guiding members, and a plurality of laser beams Q can be irradiated from the irradiation surface 391a. Therefore, it is possible to manufacture a laser irradiation apparatus that can be readily controlled with low cost.

In addition, since it is possible to change the distribution density of the gettering sinks 4 just by increasing the number of optical guiding members, it can be suitably applied to a large-diameter single crystal wafer with low cost.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a semiconductor substrate dedicated to a semiconductor device, the method comprising:
   heating the semiconductor substrate in a temperature range greater than or equal to 400° C. and less than or equal to 1000° C.;
   a multi-photon absorption process in which a laser beam is incident to one surface of the heated semiconductor substrate which is maintained in the temperature range of the heating of the semiconductor substrate, and in which the laser beam is condensed into any micro-region of the heated semiconductor substrate; and
   forming a gettering sink by changing a crystal structure of the micro-region through the multi-photon absorption process.

2. The method according to claim 1, wherein the laser beam is an ultra-short pulsed-laser beam having a pulse width of $1.0 \times 10^{-15}$ to $1.0 \times 10^{-8}$ seconds and a wavelength of 300 to 1200 nm.

3. The method according to claim 2, wherein the ultra-short pulsed-laser beam in the micro-region is controlled such that a peak output density ranges from $1.0 \times 10^6$ to $1.0 \times 10^{11}$ sec·W/cm$^2$ and a beam diameter ranges from 1 μm to 10 mm.

4. The method according to claim 1, wherein the forming the gettering sink is performed under a non-oxidizing gas atmosphere containing at least one selected from a group consisting of nitrogen, argon, and hydrogen.

5. The method according to claim 1, further comprising forming an epitaxial layer on the one surface of the semiconductor substrate.

* * * * *